US006754095B2

United States Patent
Tanaka et al.

(10) Patent No.: US 6,754,095 B2
(45) Date of Patent: Jun. 22, 2004

(54) DIGITAL TO ANALOG CONVERTER INCLUDING A FERROELECTRIC NON-VOLATILE SEMICONDUCTOR MEMORY, AND METHOD FOR CONVERTING DIGITAL DATA TO ANALOG DATA

(75) Inventors: Masahiro Tanaka, Kanagawa (JP); Toshiyuki Nishihara, Kanagawa (JP); Yukihisa Tsuneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/283,313

(22) Filed: Oct. 29, 2002

(65) Prior Publication Data

US 2003/0128570 A1 Jul. 10, 2003

(30) Foreign Application Priority Data

Oct. 31, 2001 (JP) ........................................ 2001-334360

(51) Int. Cl.$^7$ .............................................. G11C 11/22
(52) U.S. Cl. .............................. 365/145; 365/51; 365/63
(58) Field of Search ............................ 365/145, 63, 51

(56) References Cited

U.S. PATENT DOCUMENTS 6,084,795 A * 7/2000 Nunokawa ................... 365/145
6,496,407 B2 * 12/2002 Ashikaga ..................... 365/145

* cited by examiner

Primary Examiner—Richard Elms
Assistant Examiner—Pho M. Luu
(74) Attorney, Agent, or Firm—Robert J. Depke; Holland + Knight

(57) ABSTRACT

A D/A converter capable of temporally controlling output of analog data during D/A conversion is provided. The digital to analog converter includes a ferroelectric non-volatile semiconductor memory. The ferroelectric non-volatile semiconductor memory includes a data line, a memory unit which has M memory cells, and M plate lines. Each of the memory cells includes a first electrode, a ferroelectric layer and a second electrode. The first electrode of the memory cells is shared in the memory unit and is connected to the data line. The second electrode of the mth memory cell is connected to the mth plate line. And the area of the ferroelectric layer of the memory cells varies among the memory cells.

66 Claims, 17 Drawing Sheets

DIGITAL TO ANALOG CONVERTER INCLUDING A FERROELECTRIC NON-VOLATILE SEMICONDUCTOR MEMORY, AND METHOD FOR CONVERTING DIGITAL DATA TO ANALOG DATA

CROSS REFERENCES TO RELATED APPLICATIONS

The present invention claims priority to its priority document No. 2001-334360 filed in the Japanese Patent Office on Oct. 31, 2001, the entire contents of which are incorporated herein by reference.

BACKGROUND OF THE INVENTION

1. Field of the Invention

The present invention relates to a digital to analog converter comprising a ferroelectric non-volatile semiconductor memory (so-called FERAMS), and to a method of converting digital data to analog data using the digital to analog converter above.

2. Description of the Related Art

There are various known digital to analog converters (hereinafter abbreviated as D/A converters) such as those using a load resistor, or a ladder resistor network, and those which obtain analog output by converting digital input into a pulse number or pulse width and passing it through a low-pass filter.

In general, these conventional D/A converters do not have memory functions. Therefore, it is difficult for a conventional D/A converter by itself to temporally control the outputting of the converted analog data, and in order to retain or edit the converted analog data, a separate device or storage medium is required. In addition, in converting a large volume of digital data, a high-speed D/A converter is required, and converting a large volume of digital data to analog data is thus difficult.

SUMMARY OF THE INVENTION

Therefore, one aspect of the present invention is to provide a novel digital to analog converter which, in the conversion of digital data to analog data, enables temporal controlling of the outputting of the converted analog data, and/or which enables high-speed conversion of a large volume of digital data to analog data, and is also to provide a method for converting digital data to analog data using such a digital to analog converter.

A digital to analog converter according to a first aspect of the present invention is a digital to analog converter including a ferroelectric non-volatile semiconductor memory, wherein the ferroelectric non-volatile semiconductor memory comprises:
(A) a data line; and
(B) N (where N≧2) memory units;

each of the memory unit comprises:
(B-1) a selection transistor;
(B-2) a memory cell comprising a first electrode, a ferroelectric layer and a second electrode; and
(B-3) a plate line;

wherein the first electrode is connected to the data line via the selection transistor,
the second electrode is connected to the plate line, and
the area of the ferroelectric layer of the individual memory cells differs among the memory cells.

A digital to analog converter according to a second aspect of the present invention is a digital to analog converter comprising a ferroelectric non-volatile semiconductor memory, wherein the ferroelectric non-volatile semiconductor memory comprises:
(A) a data line;
(B) a memory unit comprising M (where M≧2) memory cells; and
(C) M plate lines, each of the memory cells comprises a first electrode, a ferroelectric layer and a second electrode,
the first electrode of the memory cells is shared in the memory unit and is connected to the data line,
the second electrode of the mth (where m=1, 2, . . . M) memory cell in the memory unit is connected to the mth plate line, and
the area of the ferroelectric layer of the individual memory cells differs among the memory cells.

A digital to analog converter according to a third aspect of the present invention is a digital to analog converter including a ferroelectric non-volatile semiconductor memory, wherein the ferroelectric non-volatile semiconductor memory comprises:
(A) a data line;
(B) N (where N≧2) memory units individually comprising M (where M≧2) memory cells; and
(C) M×N plate lines;

wherein the N memory units are layered with an insulation layer in between each,
each of the memory cells comprises a first electrode, a ferroelectric layer and a second electrode,
in each memory unit, the first electrode of the memory cell is shared, and is connected to the data line,
the second electrode of the mth (where m=1, 2, . . . M) memory cell in the memory unit of the nth (where n=1, 2, . . . N) layer is connected to the [(n−1)M+m]th plate line, and
the area of the ferroelectric layer of the memory cells differs among the memory cells.

A digital to analog converter according to a fourth aspect of the present invention is a digital to analog converter including a ferroelectric non-volatile semiconductor memory, wherein the ferroelectric non-volatile semiconductor memory comprises:
(A) a data line;
(B) N (where N≧2) selection transistors;
(C) N memory units each comprising M (where M≧2) memory cells; and
(D) M plate lines;

wherein each of the memory cells comprises a first electrode, a ferroelectric layer and a second electrode,
in each of the memory units, the first electrode of the memory cells is shared,
the shared first electrode of the nth (where n=1, 2, . . . N) memory unit is connected to the data line via the nth selection transistor,
in the nth memory unit, the second electrode of the mth (where m=1, 2, . . . M) memory cell is connected to the mth plate line which is shared between the memory units, and
the area of the ferroelectric layer of the memory cells in each of the memory units differs among the memory cells.

A digital to analog converter according to a fifth aspect of the present invention is a digital to analog converter comprising a ferroelectric non-volatile semiconductor memory, wherein the ferroelectric non-volatile semiconductor memory comprises:
(A) N (where $N \geq 2$) data lines;
(B) N selection transistors;
(C) N memory units each comprising M (where $M \geq 2$) memory cells; and
(D) M plate lines;

N memory units are layered with an insulation layer in between each, each of the memory cells comprises a first electrode, a ferroelectric layer and a second electrode, in each of the memory units, the first electrode of the memory cells is shared, the shared first electrode in the memory unit of the nth (where $n=1, 2, \ldots N$) layer is connected to the nth data line via the nth selection transistor, the second electrode of the mth (where $m=1, 2, \ldots M$) memory cell in the memory unit of the nth layer is connected to the mth plate line which is shared between the memory units, and the area of the ferroelectric layer of the memory cells in each of the memory units differs among the memory cells.

A method for converting digital data to analog data according to the first aspect of the present invention is a method for converting a digital data of M bits to analog data using a digital to analog converter including a ferroelectric non-volatile semiconductor memory, wherein the ferroelectric non-volatile semiconductor memory comprises:

(A) a data line; and
(B) N (where $N \geq 2$) memory units;

each of the memory units comprises:
(B-1) a selection transistor;
(B-2) a memory cell comprising a first electrode, a ferroelectric layer and a second electrode; and
(B-3) a plate line;

the first electrode is connected to the data line via the selection transistor, the second electrode is connected to the plate line, and the area of the ferroelectric layer of the individual memory cells differs among the memory cells, and the method comprises the steps of:
setting the selection transistor to a conductive condition and driving the data line and the plate line to write the mth binary data (where $m=1, 2, \ldots M$) in the memory cells of the mth memory unit;
setting the selection transistor to a conductive condition, and driving all plate lines to simultaneously read out data from the memory cells in all of the memory units; and
outputting the resultant electric potential which is generated across the data line.

A method for converting digital data to analog data according to the second aspect of the present invention is a method for converting M bits of digital data to analog data using a digital to analog converter, wherein the digital to analog converter includes a ferroelectric non-volatile semiconductor memory, the ferroelectric non-volatile semiconductor memory comprises:
(A) a data line;
(B) a memory unit comprising M (where $M \geq 2$) memory cells; and
(C) M plate lines, each of the memory cells comprises a first electrode, a ferroelectric layer and a second electrode, in the memory unit, the first electrode of the memory cells is shared, and is connected to the data line, the second electrode of the mth (where $m=1, 2, \ldots M$) memory cell in the memory unit is connected to the mth plate line, the area of the ferroelectric layer of the individual memory cells differs among the memory cells, and the method comprises the steps of:
driving the data line and the plate line to write the mth binary data in the mth memory cell;
activating all plate lines to simultaneously read out data from all memory cells; and
outputting the resultant electric potential which is generated across the data line.

A method for converting digital data to analog data according to the third aspect of the present invention is a method for converting M×N bits of digital data to analog data using a digital to analog converter, wherein the digital to analog converter includes a ferroelectric non-volatile semiconductor memory, the ferroelectric non-volatile semiconductor memory comprises:
(A) a data line;
(B) N (where $N \geq 2$) memory units each comprising M (where $M \geq 2$) memory cells; and
(C) M×N plate lines;

the N memory units are layered with an insulating layer in between each, each of the memory cells comprises a first electrode, a ferroelectric layer and a second electrode, in each memory unit, the first electrode is shared, and is connected to the data line, in the memory unit of the nth layer (where $n=1, 2, \ldots N$), the second electrode of the mth (where $m=1, 2, \ldots M$) memory cell is connected to the [(n−1)M+m]th plate line, the area of the ferroelectric material layer of the individual memory cells differs among the memory cells, and the method comprises the steps of:
driving the data line and the plate line to write the binary data of the [(n−1)M+m]th bit in the [(n−1)M+m]th memory cell; and
activating all plate lines to thereby simultaneously read out data from all memory cells and output the resultant electric potential which is generated across the data line.

A method for converting digital data to analog data according to the fourth aspect of the present invention is a method for converting M bits of digital data to analog data using a digital to analog converter, wherein the digital to analog converter includes a ferroelectric non-volatile semiconductor memory, the ferroelectric non-volatile semiconductor memory comprises:
(A) a data line;
(B) N (where $N \geq 2$) selection transistors;
(C) N memory units each comprising M (where $M \geq 2$) memory cells; and (D) M plate lines;

each of the memory cells comprises a first electrode, a ferroelectric layer and a second electrode, in each of the memory units, the first electrode of the memory cells is shared, the shared first electrode in the nth (where n=1, 2, ... N) memory unit is connected to the data line via the nth selection transistor, the second electrode of the mth (where m=1, 2, ... M) memory cell in the nth memory unit is connected to the mth plate line which is shared between the memory units, in each of the memory units, the area of the ferroelectric layer of the memory cells differs among the memory cells, and the method comprises the steps of:

setting the selection transistor to a conductive condition, and driving all the data lines and the plate lines to write a binary data of the mth bit in the mth memory cell in the nth memory unit;

setting the nth selection transistor to a conductive condition, and driving all the plate lines to simultaneously read out data from all the memory cells in the nth memory unit; and outputting the resultant electric potential which is generated across the data line.

A method for converting digital data to analog data according to the fifth aspect of the present invention is a method for converting M×N bits of digital data to analog data using a digital to analog converter, wherein the digital to analog converter includes a ferroelectric non-volatile semiconductor memory, the ferroelectric non-volatile semiconductor memory comprises:

(A) a data line;
(B) N (where N≧2) selection transistors;
(C) N memory units each comprising M (where M≧2) memory cells; and
(D) M plate lines;

each of the memory cells comprises a first electrode, a ferroelectric layer and a second electrode, in each of the memory units, the first electrode of the memory cells is shared, the shared first electrode in the nth (where n=1, 2, ... N) memory unit is connected to the data line via the nth selection transistor, in the nth memory unit, the second electrode of the mth (where m=1, 2, ... M) memory cell is connected to the mth plate line which is shared between the memory units, the area of the ferroelectric layer of the memory cells differs among the memory cells, and the method comprises the steps of:

setting the nth selection transistor to a conductive condition, and driving the data line and the plate line to write a binary data of the [(n−1)M+m]th bit in the mth memory cell in the nth memory unit;

setting all the selection transistors to a conductive condition, and driving all the plate lines to simultaneously read out data from all the memory cells in the nth memory unit; and outputting the resultant electric potential which is generated across the data line.

A method for converting digital data to analog data according to a sixth aspect of the present invention is a method for converting M bits of digital data to analog data using a digital to analog converter, wherein the digital to analog converter includes a ferroelectric non-volatile semiconductor memory, the ferroelectric non-volatile semiconductor memory comprises:

(A) N (where N≧2) data lines;
(B) N selection transistors;
(C) N memory units each comprising M (where M≧2) memory cells; and
(D) M plate lines;

the N memory units are layered with an insulation layer in between each, each of the memory cells comprises a first electrode, a ferroelectric layer and a second electrode, in each of the memory units, the first electrode of the memory cells is shared, the shared first electrode in the memory unit of the nth (where n=1, 2, ... N) layer is connected to the nth data line via the nth selection transistor, in the memory unit of the nth layer, the second electrode of the mth (where m=1, 2, ... M) memory cell is connected to the mth plate line which is shared between the memory units, the area of the ferroelectric layer of the memory cells in each of the memory units differs among the memory cells, and the method comprises the steps of:

setting the nth selection transistor to a conductive condition, and driving the nth data line and the mth plate line to write a binary data of the mth bit in the mth memory cell in the memory unit of the nth layer;

setting the nth selection transistor to a conductive condition, and driving all the plate lines to simultaneously read out data from all the memory cells in the memory unit of the nth layer; and outputting the resultant electric potential which is generated across the nth data line.

In the digital to analog converter according to any of the first to fifth aspects of the present invention (hereinafter referred to as a D/A converter) and the method for converting digital data to analog data according to any of the first to sixth aspects of the present invention (hereinafter referred to as a D/A conversion method), the rise in electric potential ΔV is theoretically given by equation (1) below, if the amount of polarization per unit area of the ferroelectric layer, the area of the mth (m=1, 2, ... M) memory cell $MC_m$, and the total capacitance of the memory cells and data lines are, respectively, assumed to be P, $A_m$ and $C_o$. Note that $D_m$ represents the binary data stored in the memory cell $MC_m$, and has either the value of "0" or "1."

$$\Delta V = (P/C_0)\sum_{m=1}^{M}(A_m \cdot D_m) \quad \text{[Equation (1)]}$$

While the area of the ferroelectric layer of each of the memory cells may essentially be arbitrary so long as the digital data input and the analog data output correspond one to one with each other, ΔV will have a linear value if $A_m = 2^{(m-1)}A_1$ is satisfied. The electric potential generated across the data line is generally outputted after being amplified using a sense amplifier, and the area may be adjusted as deemed appropriate depending on the characteristics of the sense amplifier or on the desired output characteristics. In certain cases, the configuration may be such that a compensatory circuit is provided for output compensation so as to obtain linearity. An amplifier for amplifying the analog data may further be provided in the stages following the sense amplifier.

In the present invention, by varying the size of the ferroelectric layer of each of the memory cells, the area of the ferroelectric layer of the memory cells may be varied. By keeping the widths of the first electrodes uniform and varying the, widths of the plate lines, by keeping the widths of the plate lines uniform and varying the widths of the first electrodes, or by varying the widths of the first electrodes and the plate lines, the size of the ferroelectric layer of each of the memory cells may be varied. In addition, by providing one or more unit memory cells in each of the memory cells, and varying the number of unit memory cells in the memory cells, the area of the ferroelectric layer of the memory cells may be varied.

In the present invention, one need only satisfy the condition M≧2, but the value of M or M×N must coincide with the number of bits of the digital data to be converted, an example of which includes involutions of 2 (2, 4, 8 . . . ). In addition, in the D/A converter according to the third to fifth aspects of the present invention or in the D/A conversion method according to the third to sixth aspects of the present invention, one need only satisfy the condition N≧2 where an example of the practical values for N include involutions of 2 (2, 4, 8 . . . ). In the D/A conversion method according to the fifth embodiment of the present invention, the value of M×N must coincide with the number of bits of the digital data to be converted.

In the D/A converter according to the third aspect of the present invention, or the D/A conversion method according to the third aspect of the present invention, the memory units of the ferroelectric non-volatile semiconductor memory in a plurality of D/A converters may be layered with an insulation layer between successive layers. In the D/A converter according to the fourth aspect of the present invention, or the D/A conversion method according to the fourth or fifth aspect of the present invention, the N memory units may be formed on the same insulation layer, or they may be layered with an insulation layer between successive layers.

In the D/A converter according to the second or third aspect of the present invention, or the D/A conversion method according to the second or third aspect of the present invention, in a case where one data line is shared between a plurality of D/A converters, in other words, where a plurality of D/A converters are connected to a single data line, the ferroelectric non-volatile semiconductor memory must have a configuration in which a selection transistor is additionally provided and the first electrode shared in the memory unit is connected to the data line via the selection transistor.

In the D/A converter according to the third or fifth aspect of the present invention, the D/A conversion method according to the third or sixth aspect of the present invention, the D/A converter according to a preferred embodiment of the fourth aspect of the present invention, or the D/A conversion method according to preferred embodiments of the forth or fifth aspect of the present invention, by structuring the memory unit in three-dimensional layers, a restriction effected by the number of transistors which occupying the surface of the semiconductor substrate is removed, the storage capacity may be increased dramatically, and the effective occupied area per bit of storage may be reduced considerably.

In the D/A converter according to the third or fifth aspect of the present invention, the D/A conversion method according to the third or sixth aspect of the present invention, the D/A converter according to a preferred embodiment of the fourth aspect of the present invention, or the D/A conversion method according to a preferred embodiment of the forth or fifth aspect of the present invention, it is preferable that the crystallization temperature of the ferroelectric layer of the memory cells in the memory unit located in the upper area be lower than the crystallization temperature of the ferroelectric layer of the memory cell in the memory unit located in the lower area. The crystallization temperature of the ferroelectric layer of the memory cells may be found using, for example, an X-ray diffractometer or surface scanning electron microscope. More specifically, the crystallization temperature of the ferroelectric layer can be found by first forming the ferroelectric material layer, performing on the ferroelectric layer a thermal treatment for facilitating crystallization under varied temperatures, performing an X-ray diffraction analysis on the ferroelectric layer after the thermal treatment, and evaluating the diffraction pattern intensity (height of diffraction peaks) specific to the ferroelectric material.

In manufacturing a ferroelectric non-volatile semiconductor memory with a construction in which the memory units are layered, a thermal treatment (referred to as a crystallization thermal treatment) must be performed a number of times equaling the number of layered memory units in order to crystallize the ferroelectric layer or a ferroelectric thin film of the ferroelectric layer. As a result, the memory units located in the lower stages undergo a longer period of crystallization thermal treatment, and the memory units located in the upper stages undergo a shorter period of crystallization thermal treatment. Therefore, if a crystallization thermal treatment optimal for the memory units located in the upper stages is performed, there are risks that the memory units located in the lower stages suffer an excessive thermal load, and that degradation in the characteristics of the memory units located in the lower stages may occur. There is an alternative method in which the crystallization thermal treatment is performed once after the multi-layered memory units are formed, but in this case, there is a high likelihood that a large volume change of the ferroelectric layers occurs during crystallization, or that degassing occurs in each of the ferroelectric layers, and problems such as cracks in or peeling of the ferroelectric layers are likely to occur. Such degradation in the characteristics of the memory cells of the memory units located in the lower stages will not occur if the crystallization temperature of the ferroelectric layer of the memory units located in the upper stages is lower than the crystallization temperature of the ferroelectric layer of the memory units located in the lower stages even if the crystallization thermal treatment is carried out a number of times equaling the number of the layered memory units. Further, a crystallization treatment may be performed on the memory cells in the memory unit of each layer under optimal conditions, thereby producing a ferroelectric non-volatile semiconductor memory with superior characteristics. Table 1 below shows the crystallization temperatures of typical materials for the ferroelectric layer, but materials for the ferroelectric layer are by no means limited thereto.

TABLE 1

| Material | Crystallization temperature |
| --- | --- |
| $Bi_2SrTa_2O_9$ | 700–800° C. |
| $Bi_2Sr(Ta_{1.5}, Nb_{0.5})O_9$ | 650–750° C. |
| $Bi_4Ti_3O_{12}$ | 600–700° C. |

TABLE 1-continued

| Material | Crystallization temperature |
|---|---|
| $Pb(Zr_{0.48}, Ti_{0.52})O_3$ | 550–650° C. |
| $PbTiO_3$ | 500–600° C. |

Materials for the ferroelectric layer in the present invention include bismuth (Bi) layered compounds, or more specifically, ferroelectric materials of a Bi-based layered perovskite type. The ferroelectric materials of a Bi-based layered perovskite type belong to the so-called group of non-stoichiometric compounds, and have a tolerance for compositional shifts on both sites, the metal element and the anion (oxygen, etc). It is also not unusual that optimal electric characteristics appear at a composition slightly off the stoichiometric composition. The Bi-based layered perovskite type ferroelectric material can typically be expressed by a general formula $(Bi_2O_2)^{2+}(A_{m-1}B_mO_{3m+1})^{2-}$, where "A" represents any one metal selected from the group comprising Bi, Pb, Ba, Sr, Ca, Na, K, Cd and so forth, "B" represents any one metal or a combination of a plurality of metals at an arbitrary ratio selected from the group comprising Ti, Nb, Ta, W, Mo, Fe, Co and Cr, and m represents an integer of 1 or larger.

The material for the ferroelectric layer preferably contains, as its dominant crystalline phase, a crystalline phase expressed by $$(Bi_X, Sr_{1-X})_2(Sr_Y, Bi_{1-Y})(Ta_Z, Nb_{1-Z})_2O_d \quad \text{Formula (1)}$$

(where $0.9 \leq X \leq 1.0$, $0.7 \leq Y \leq 1.0$, $0 \leq Z \leq 1.0$ and $8.7 \leq d \leq 9.3$). It is also preferable that the material for the ferroelectric layer contains, as its dominant crystalline phase, a crystal phase expressed by $$Bi_X Sr_Y Ta_2 O_d \quad \text{Formula (2)}$$

(where $X+Y=3$, $0.7 \leq Y \leq 1.3$ and $8.7 \leq d \leq 9.3$). In these cases, it is further preferable that the crystalline phase expressed by formula (1) or (2) is contained as the dominant crystalline phase in a percentage of 85% or more. It should be noted that the expression $(Bi_X, Sr_{1-X})$ in formula (1) means that the site ordinarily occupied by Bi in the crystal structure is occupied by Sr, and that the ratio of Bi and Sr is given by $X:(1-X)$. Similarly, the expression $(Sr_Y, Bi_{1-Y})$ means that the site ordinarily occupied by Sr in the crystal structure is occupied by Bi, and that the ratio of Sr and Bi is given by $Y:(1-Y)$. The materials for the ferroelectric layer containing, as the dominant crystalline phase, the crystalline phase expressed by formula (1) or (2) may sometimes contain a slight amount of oxides of Bi, oxides of Ta and Nb, or composite oxides of Bi, Ta and Nb.

The materials for the ferroelectric layer may also contain a crystalline phase expressed by $$Bi_X(Sr, Ca, Ba)_Y(Ta_Z, Nb_{1-Z})_2O_d \quad \text{formula (3)}$$

(where $1.7 \leq X \leq 2.5$, $0.6 \leq Y \leq 1.2$, $0 \leq Z \leq 1.0$ and $8.0 \leq d \leq 10.0$). It should be noted that the expression (Sr, Ca, Ba) expresses a single element selected from the group consisting of Sr, Ca and Ba. Stoichiometric expressions of the composition of the materials for the ferroelectric layer expressed by these formulae include, for example, $Bi_2SrTa_2O_9$, $Bi_2SrNb_2O_9$, $Bi_2BaTa_2O_9$, $Bi_2Sr(Ta,Nb)_2O_9$ and so forth. As the material for the ferroelectric layer, $Bi_4SrTi_4O_{15}$, $Bi_3TiNbO_9$, $Bi_3TiTaO_9$, $Bi_4Ti_3O_{12}$, $Bi_2PbTa_2O_9$ and so forth may also be cited as examples, and the ratio of the individual metal elements may be varied as long as the crystal structure remains unchanged. In other words, there may be compositional shifts at both sites, the metal elements and the oxygen element.

Still other examples of the material for the ferroelectric layer include $PbTiO_3$, and PZT-based compounds such as lead zirconate titanate (PZT; $Pb(Zr_{1-y}, Ti_y)O_3$, where $0<y<1$) which is a solid solution of $PbZrO_3$ and $PbTiO_3$ having a perovskite structure, PLZT which is a metal oxide obtained by adding La to PZT, and PNZT which is a metal oxide obtained by adding Nb to PZT.

The crystallization temperature of the above-described materials for the ferroelectric layer may be varied by shifting their compositions away from the stoichiometric compositions.

The ferroelectric material layer may be obtained by first forming a ferroelectric film and then patterning the ferroelectric film in a later process. In some cases, the patterning may be omitted. The ferroelectric thin-film may be formed by a method suitable for the material used in the ferroelectric thin-film, such as the MOCVD process, pulse laser ablation process, sputter method and sol-gel method. The ferroelectric film may be patterned by an anisotropic reactive ion etching (RIE) method.

In the present invention, configurations in which the first electrode is formed under the ferroelectric layer and the second electrode is formed above the ferroelectric layer (that is, the first electrode corresponds to a lower electrode and the second electrode to an upper electrode), or in which the first electrode is formed above the ferroelectric layer and the second electrode is formed under the ferroelectric layer (that is, the first electrode corresponds to the upper electrode and the second electrode to the lower electrode) may be adopted. It is preferable from the standpoint of wiring structure simplification that the plate line extend from the second electrode. A structure in which the first electrode is shared includes a configuration in which the first electrode of a stripe form is formed, and the ferroelectric layer is formed so as to cover the entire surface of the first electrode. In such a structure, the areas where the first electrode, the ferroelectric layer and the second electrode overlap correspond to memory cells. Other examples of the structure in which the first electrode is shared includes a structure where ferroelectric layers are individually formed in predetermined areas of the first electrode and the second electrodes are formed on the ferroelectric layers, or a structure where the first electrodes are individually formed in predetermined surface areas of a wiring layer, the ferroelectric layers are formed on each of the first electrodes and the second electrodes are formed on the ferroelectric layers, but the structure is, by no means, limited thereto.

Further, in the present invention, for the case where the first electrode is formed under the ferroelectric layer and the second electrode is formed above the ferroelectric layer, it is preferable that the first electrode of the memory cell have a so-called damascene structure; and for the case where the first electrode is formed above the ferroelectric layer and the second electrode is formed under the ferroelectric layer, it is preferable that the second electrode of the memory cell have a so-called damascene structure; both of which are preferable in the present invention from the standpoint of forming the ferroelectric layer on a planar foundation.

In the present invention, as the material for the first or second electrode, Ir, $IrO_{2-X}$, $IrO_{2-X}/Ir$, $SrIrO_3$, Ru, $RuO_{2-X}$, $SrRuO_3$, Pt, $Pt/IrO_{2-X}$, $Pt/RUO_{2-X}$, Pd, a layered structure of Pt/Ti, a layered structure of Pt/Ta, a layered structure of Pt/Ti/Ta, $La_{0.5}Sr_{0.5}CoO_3$ (LSCO), a layered structure of Pt/LSCO and YBa$_2$Cu$_3$O$_7$, where 0≦X<2, may be cited. It should be noted that in the above expressions of the layered structures, materials placed before the "/" contact the ferroelectric layer. The first and second electrodes may be formed with the same material, with the same kind of materials, or with different kinds of materials. The first and second electrodes may be formed by first forming a conductive layer of the first or second electrode, and then patterning the conductive layer in a later process. The conductive layer may be formed by a method suitable for the material used in the conductive layer, which includes a sputter method, reactive sputter method, electron beam deposition method, MOCVD method and pulse laser ablation process. The conductive layer may be patterned, for example, by the ion milling method or RIE method.

The selection transistor may be configured with a MIS-FET or MOS-FET. Materials which may be used for the data line include impurity-doped polysilicon or refractory metal materials. The selection transistor and the first electrode, the selection transistor and the data line may be connected via a connection hole, and the connection hole may be obtained by embedding a tungsten plug or polysilicon doped with impurities.

In the present invention, examples of materials which may be used for the insulation layer include silicon oxide (SiO$_2$), silicon nitride (SiN), SiON, SOG, NSG, BPSG, PSG, BSG and LTO.

In the present invention, binary data which constitute digital data are written (stored) in each of the plurality of memory cells. When these data are read out simultaneously, the electric potential appearing across the data line varies depending on the data stored in the individual memory cells. Thus, digital data may be converted to analog data with a simple configuration. Further, as the data herein are stored in the ferroelectric layer, the memory is non-volatile.

In the present invention, a configuration in which a plurality of the D/A converters are juxtaposed in an array (hereinafter, such a configuration will be referred to as a D/A converter array for convenience), and the plate line of the memory cells in the individual ferroelectric non-volatile semiconductor memories is shared. As a result, high-speed conversion of a large volume of digital data to analog data becomes possible. In addition, by providing, for example, 2 such D/A converter arrays, digital data may be inputted into one of the D/A converter arrays while analog data is outputted from the other D/A converter array, thereby making it possible to convert a still larger volume of digital data to analog data at an even higher speed.

An operational principle of the memory cell will be explained below. The memory cell referred to herein is one in which changes in the amount of charge accumulated in the ferroelectric layer is detected through the use of high-speed polarization inversion and residual polarization of the ferroelectric thin-film, and in which high-speed rewriting is possible. Reading and writing data from and in the memory cell is performed through an application of the P–E(V) hysteresis loop of a ferroelectric material as shown in FIG. 17. That is, the ferroelectric layer will show residual polarization when an external electric field is applied thereto and is then removed. The residual polarization of the ferroelectric layer will be +P$_r$ when the external electric field is applied in the positive direction, and will be –P$_r$ when the external electric field is applied in the negative direction. Here, the state in which the residual polarization is +P$_r$ (see point D in FIG. 17) is taken to be "0," and the state in which the residual polarization is –P$_r$ (see point A in FIG. 17) is taken to be "1."

In order to determine whether the status is "1" or "0," an electric field in the positive direction, for example, is applied to the ferroelectric layer. As a result, the polarization status of the ferroelectric material layer becomes that indicated by point "C" in FIG. 17. If the data was "0," the polarization status of the ferroelectric layer changes from "D" to "C." On the other hand, if the data was "1," the polarization status of the ferroelectric layer changes from "A" to "C" via "B." That is, polarization inversion of the ferroelectric layer does not occur when the data is "0," but does occur when the data is "1." As a result, there is generated a difference in the amount of charge accumulated in the memory cells (capacitor portion), and the accumulated charge is detected as a signal current.

According to the present invention, in writing binary data constituting digital data in each of a plurality of memory cells and simultaneously reading out the data, the electric potential appearing across the data line varies depending on the data stored in the individual memory cells. Thus, digital data may be converted to analog data with a simple construction. Moreover, since the data is stored in the ferroelectric layer, it is non-volatile, which allows for temporal controlling of the output of the converted analog data based on external or internal signals. No separate device nor storage medium for holding or editing the analog data is necessary, and it also makes it possible to output low-frequency analog data depending on capabilities of a device to which the analog data is outputted, or to output the stored data as analog data as required based on an external trigger. The present invention also enables high-speed conversion of a large volume of digital data to analog data.

BRIEF DESCRIPTION OF THE DRAWINGS

The above and other aspects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS

Figure 1:
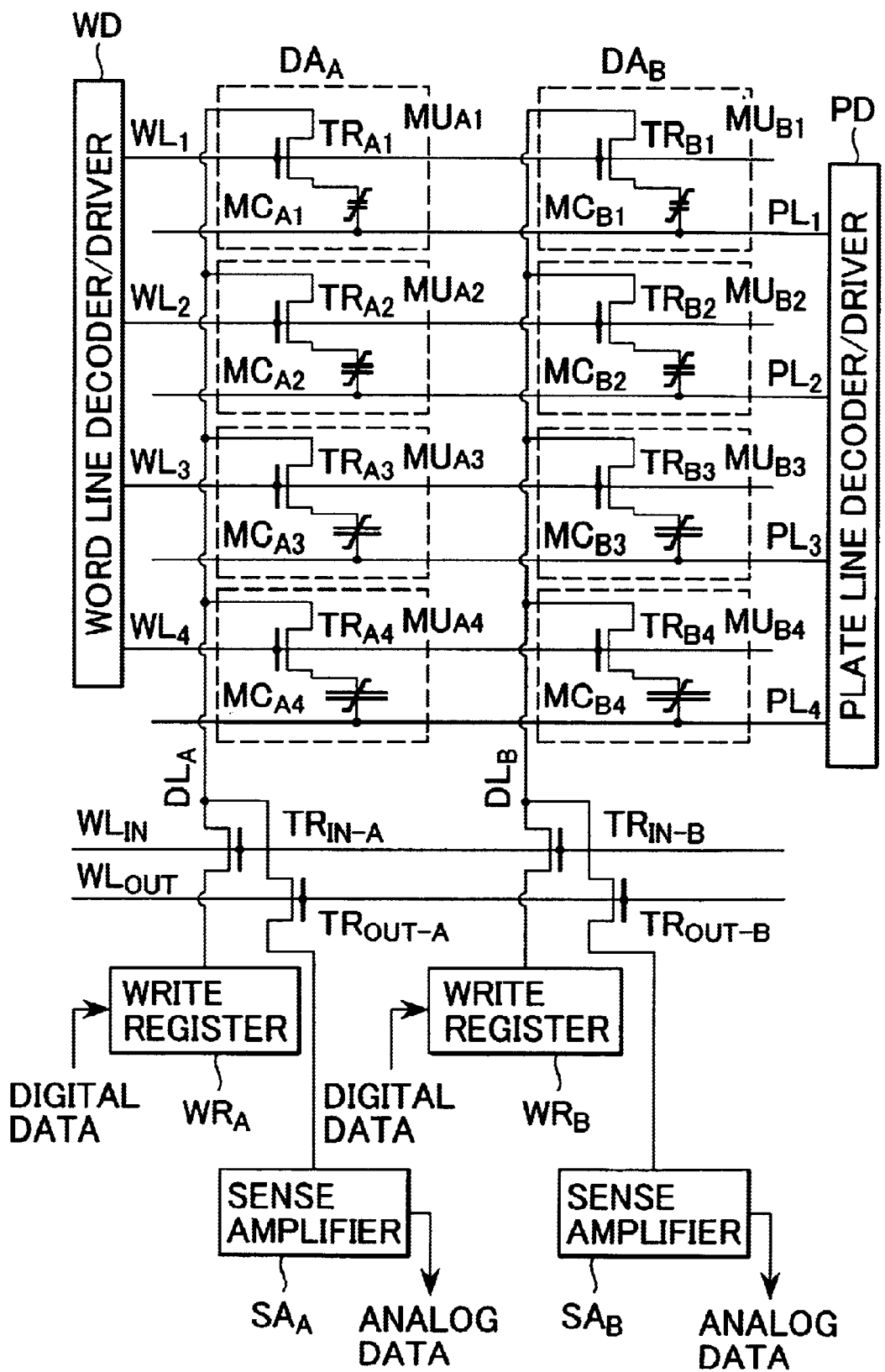
FIG. 1 is a circuit diagram of a digital to analog converter according to a first embodiment of the present invention.

Embodiments of the invention will be detailed below with reference to the attached drawings. It is to be noted that some of the subscripts in the drawings may, in some cases, be expressed as two-digit numbers, for example, such as "11" for purposes of simplicity where it should really be expressed as "1,1." The same applies to three-digit subscripts. In addition, a subscript "M" is used to indicate a plurality of memory cells, plate lines and the like as a whole, and a subscript "m" is used to indicate individually a plurality of memory cells, plate lines and the like. A subscript "N" is used to indicate a plurality of selection transistors, memory units and the like as a whole, and a subscript "n" is used to indicate individually a plurality of selection transistors, memory units and the like.

(First Embodiment)

Figure 2A:
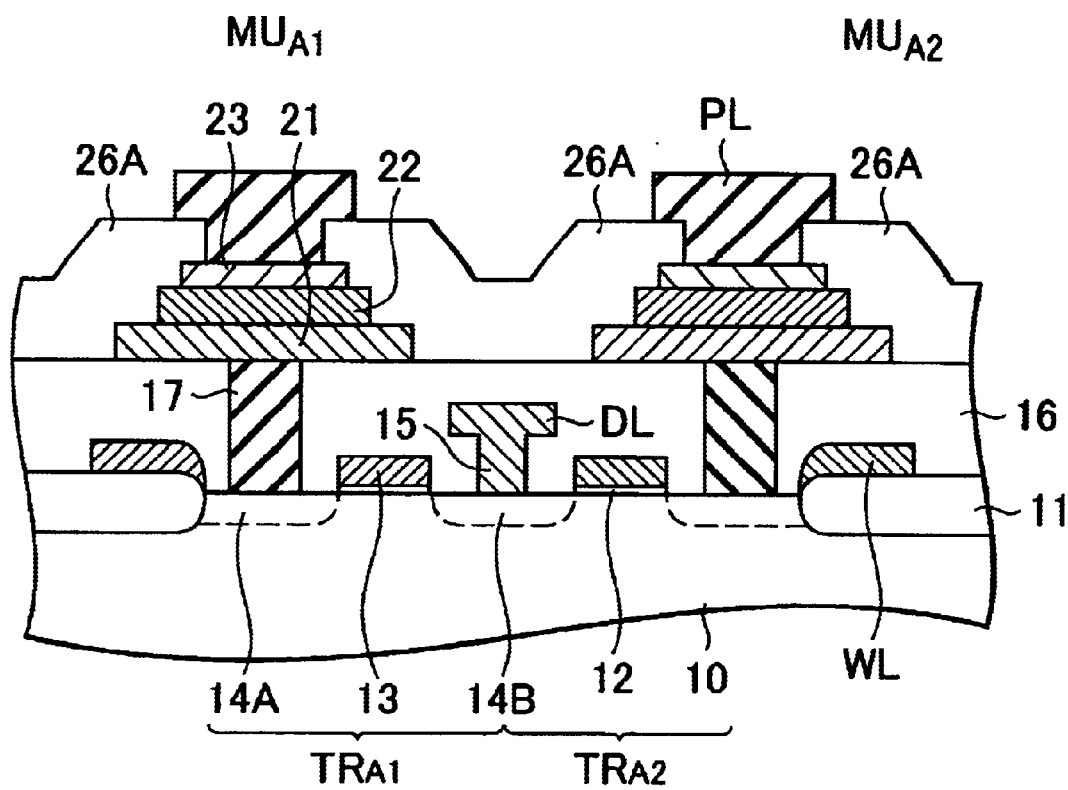
FIGS. 2A and 2B are schematic sectional views of a ferroelectric non-volatile semiconductor memory in the digital to analog converter according to the first embodiment of the present invention.

The first embodiment relates to a D/A analog converter according to the first aspect of the present invention, and a method of D/A conversion according to the first aspect of the present invention. A circuit diagram of the D/A converter according to the first embodiment is shown in FIG. 1, and a schematic sectional view of 2 memory cells of the D/A converter comprising a plurality of such memory cells are shown in FIG. 2A. FIG. 1 shows two D/A converters $DA_A$, $DA_B$ having plate lines are shared. Since the D/A converters $DA_A$, $DA_B$ have the same configuration, the description to follow is given mainly with respect to the D/A converter $DA_A$.

The D/A converter $DA_A$ according to the first embodiment comprises a ferroelectric non-volatile semiconductor memory (hereinafter referred to as a "non-volatile memory"), and converts N bits (N=4) of digital data to analog data. The non-volatile memory comprises a data line $DL_A$ and N memory units $MU_{AN}$ (where N≧2, and, in the first embodiment, N=4).

Each memory unit $MU_{An}$ comprises a selection transistor $TR_{An}$; a memory cell $MC_{An}$ which comprises a first electrode 21, a ferroelectric layer 22 and a second electrode 23; and a plate line $PL_n$. The first electrode 21 of the memory cell $MC_{An}$ is connected to the data line $DL_A$ via the selection transistor $TR_{An}$, and the second electrode 23 is connected to the plate line $PL_n$.

The areas of the ferroelectric layers 22 of the memory cells $MC_{AN}$ differ among the memory cells. More specifically, the sizes of the ferroelectric layers 22 of the memory cell $MC_{AN}$ differ. Still more specifically, the widths of the plate lines $PL_N$ are kept uniform while the widths of the first electrodes 21 are varied, but it is not limited as such. Assuming that the nth (n=1, 2, ... N) memory cell $MC_{An}$ has an area of $A_n$, $A_n = 2^{(n+1)} A_1$ is satisfied.

The memory cell as shown in FIG. 2A has a stacked structure. This stacked memory cell comprises selection transistors $TR_{A1}$, $TR_{A2}$ formed on a semiconductor substrate 10, an insulation layer 16 formed on the entire surface of the semiconductor substrate 10, the first electrode (lower electrode) 21 formed on the insulation layer 16, the ferroelectric layer 22 formed on the first electrode 21, the second electrode (upper electrode) 23 formed on the ferroelectric layer 22, and a connection hole 17 for establishing an electric connection between one source/drain region 14A of the selection transistor and the first electrode 21. The connection hole 17 is formed by filling an opening formed in the insulation layer 16 with a conductive material such as polysilicon or tungsten. After the connection hole 17 is formed, the first electrode 21, the ferroelectric layer 22 and the second electrode 23 are successively formed. In the figure, reference numeral 11 represents a device isolation region, reference numeral 12 represents a gate insulating film, reference numeral 13 represents a gate electrode, reference numeral 14B represents the other source/drain region connected to the data line DL via a connection hole 15, and reference numeral 26A represents an insulation film. Although the actual area of the ferroelectric layer 22 of the memory unit $MU_{A2}$ is larger than that of the ferroelectric layer 22 of the memory unit $MU_{A1}$, in FIG. 2A they are shown with equal sizes for simplicity.

Figure 2B:
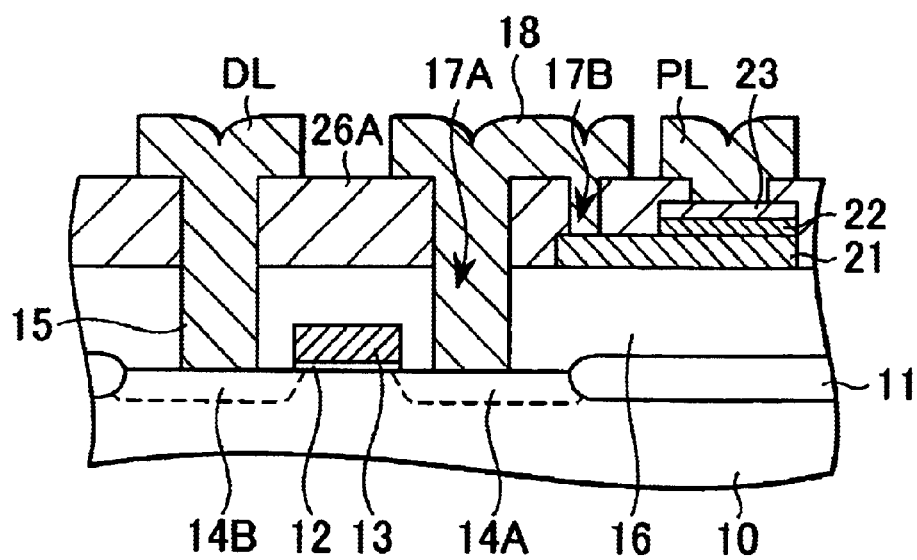

The memory cell may also be a planar memory cell as shown in FIG. 2B. This memory cell comprises a selection transistor formed on a semiconductor substrate 10, an insulation film 16 formed on the entire surface of the semiconductor substrate 10, a first electrode (lower electrode) 21 formed on the insulation film 16, a ferroelectric layer 22 formed on the first electrode 21, a second electrode (upper electrode) 23 formed on the ferroelectric layer 22, a connection hole 17A for establishing an electric connection between one source/drain region 14A of the selection transistor and the first electrode 21, a wiring 18 and a connection hole 17B. The connection holes 17A, 17B and the wiring 18 may be formed with a conductive material such as polysilicon or tungsten. The data line DL is connected to the other source/drain region 14B via a connection hole 15.

The D/A converter $DA_A$ further comprises a write register $WR_A$ connected to the data line $DL_A$ via a write-in transistor $TR_{IN-A}$, and a sense amplifier $SA_A$ connected to the data line $DL_A$ via a read-out transistor $TR_{OUT-A}$. The sense amplifier $SA_A$ may comprise a current mirror sense amplifier, for example.

A word line $WL_n$ for controlling the operation of the selection transistor $TR_{An}$, a word line $WL_{IN}$ for controlling the operation of the write-in transistor $TR_{IN-A}$, and a word line $WL_{OUT}$ for controlling the operation of the read-out transistor $TR_{OUT-A}$ are connected to a word line decoder/driver WD, and the plate line $PL_n$ is connected to a plate line decoder/driver PD.

In the operation of the D/A converter $DA_A$ according to the first embodiment, N bits (specifically 4 bits) of digital data is serially inputted to the write register $WR_A$, and binary data corresponding to the individual bits of the N-bit digital data is temporarily stored in the write register $WR_A$. In a state where the word line $WL_{IN}$ is set to a high level to thereby turn the write-in transistor $TR_{IN-A}$ on, the word lines $WL_N$ are successively set to a high level to thereby successively place the selection transistors $TR_{AN}$ in a conductive state, the data line $DL_A$ and the plate lines $PL_N$ are successively driven so as to write the binary data of the nth bit in the memory cell $MC_{An}$ of the nth memory unit $MU_{An}$. When the potential of the data line $DL_A$ is set to 0 volts and the potential of the plate line $PL_n$ is set to $V_{CC}$ volts (where $V_{CC}$ is the power supply voltage), a data of "0" is written in the memory cell $MC_{An}$. On the other hand, when the potential of the data line $DL_A$ is set to $V_{CC}$ volts and the potential of the plate line $PL_n$ is set to 0 volts, a data of "1" is written in the memory cell $MC_{An}$.

Once a desired time has elapsed, the data line $DL_A$ is equalized to 0 volts, the word line $WL_{OUT}$ and all of the word lines $WL_N$ are set to a high level, the read-out transistor $TR_{OUT-A}$ and all of the selection transistors $TR_{AN}$ are turned on, and all plate lines $PL_N$ are driven simultaneously to thereby read out data from the memory cells $MC_{AN}$ of all the memory units $MU_N$ at the same time. More specifically, $V_{CC}$ volts are applied to all of the plate lines $PL_N$. In so doing, if the data stored in the memory cell $MC_{An}$ is "1," polarization inversion occurs in the ferroelectric layer, which results in an increase in the amount of accumulated charge, and a rise in the electric potential of the data line $DL_A$. On the other hand, if the data stored in the memory cell $MC_{An}$ is "0," polarization inversion does not occur in the ferroelectric layer, and the electric potential of the data line $DL_A$ hardly increases. The rise in the electric potential $\Delta V$ of the data line $DL_A$ can generally be expressed by equation (1) described above. The electric potential thus generated across the data line $DL_A$ is read out by the sense amplifier $SA_A$ and is outputted. Conversion of digital data to analog data can thus be achieved.

As shown in FIG. 1, by adopting a configuration in which a plurality of D/A converters $DA_A$, $DA_B$ are juxtaposed, and the plate lines are shared by the memory cells of the individual non-volatile memories, high-speed conversion of a large volume of digital data to analog data is made possible. Further, by providing 2, for example, D/A converter arrays, in each of which a plurality of D/A converters are juxtaposed in an array, and by independently controlling the write registers and the read-out transistors, digital data may be inputted into one D/A converter array while outputting analog data from the other D/A converter array, and conversion of an even larger volume of digital data to analog data at a yet higher speed becomes possible.

Figure 3:
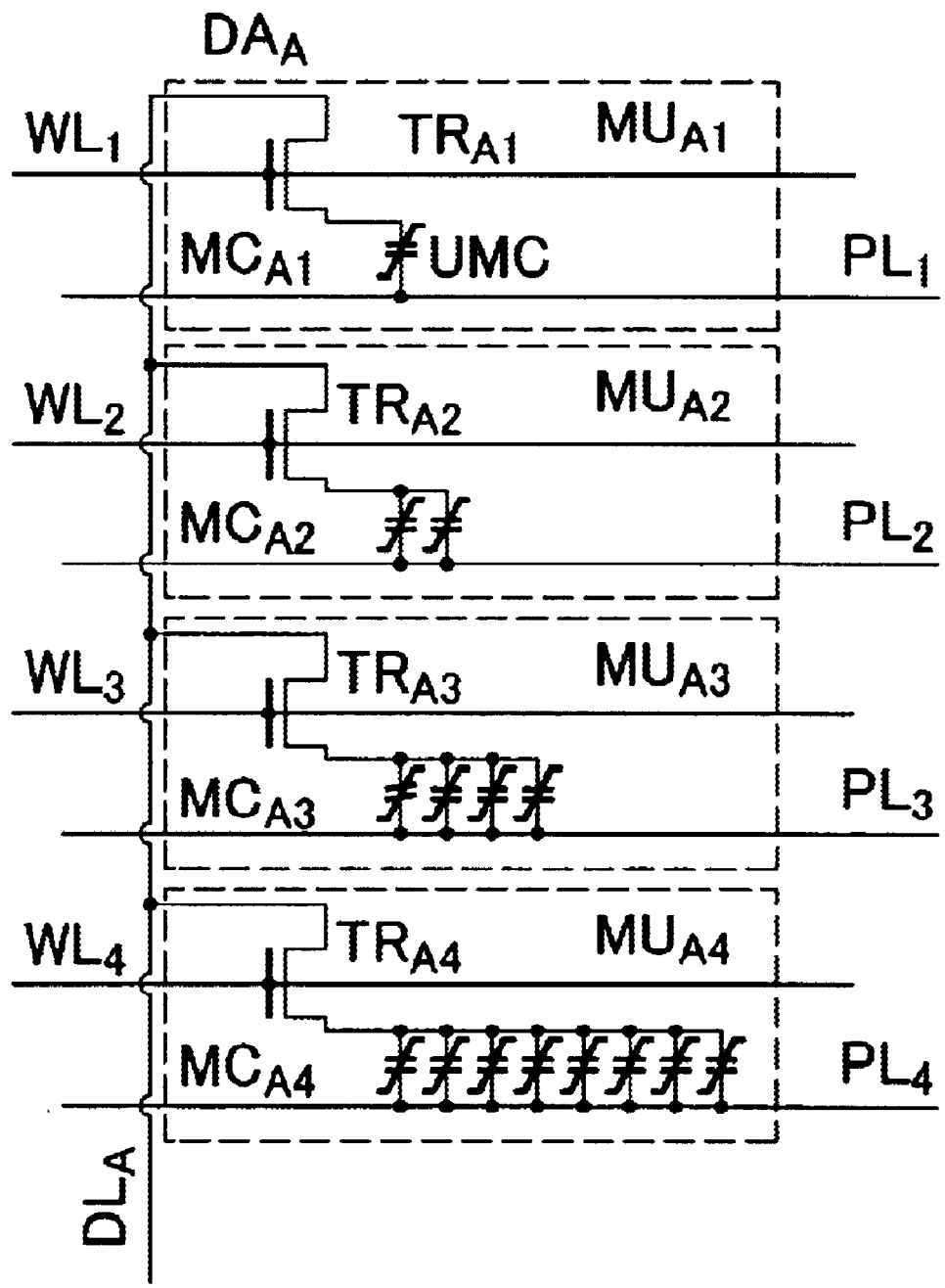
FIG. 3 is a circuit diagram of a modified example of the ferroelectric non-volatile semiconductor memory in the digital to analog converter according to the first embodiment of the present invention.

FIG. 3 shows a circuit diagram of a modified example of the D/A converter $DA_A$ according to the first embodiment. In the modified D/A converter $DA_A$, the individual memory cells comprise one or more unit memory cells UMC, where the number of unit memory cells in each of the memory cells $MC_{AN}$ is varied. The number of the unit memory cells UMC in each of the memory cells $MC_{AN}$ may, for example, be set to $2^{(n-1)}$. Alternatively, it may also be a number larger than $2^{(n-1)}$, the analog data output from the D/A converter may be measured, thereby determining the number of unit memory cells UMC, and the unnecessary unit memory cells UMC may be eliminated. The unnecessary unit memory cells UMC may be eliminated by fusing, for example, a portion connecting the first electrode and the selection transistor.

(Second Embodiment)

Figure 4:
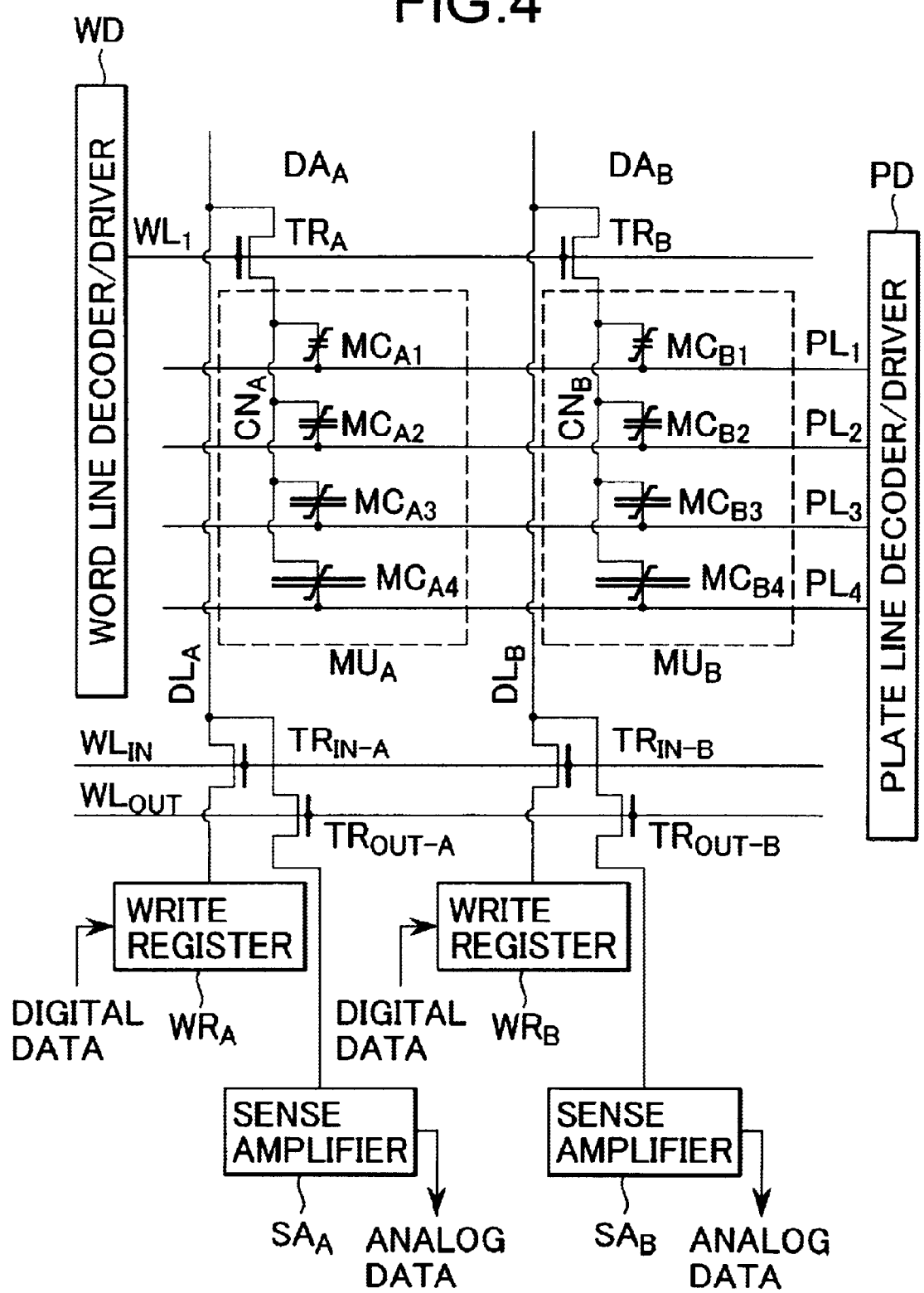
FIG. 4 is a circuit diagram of a digital to analog converter according to a second embodiment of the present invention.
Figure 5:
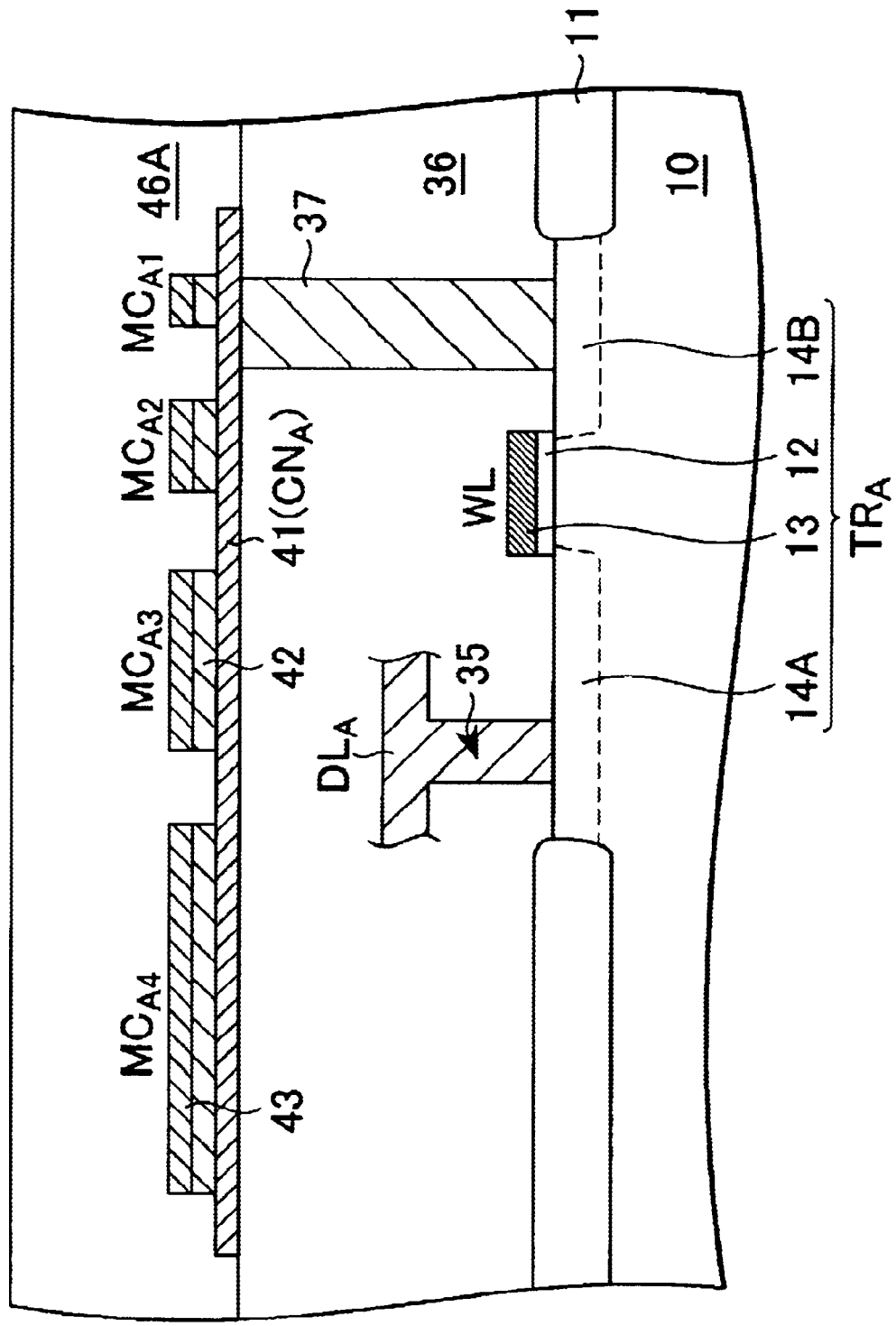
FIG. 5 is a schematic sectional view of a ferroelectric non-volatile semiconductor memory in the digital to analog converter according to the second embodiment of the present invention.

The second embodiment relates to a D/A converter according to the second aspect of the present invention, and a method of D/A conversion according to the second aspect of the present invention. A circuit diagram of the D/A converter according to the second embodiment is shown in FIG. 4, and a schematic sectional view of a non-volatile memory of the D/A converter is shown in FIG. 5. FIG. 4 shows two D/A converters $DA_A$, $DA_B$ in which plate lines are shared. Since the D/A converters $DA_A$, $DA_B$ have the same configuration, the description to follow will be given mainly with respect to the D/A converter $DA_A$.

The D/A converter $DA_A$ according to the second embodiment comprises a non-volatile memory, and is designed for converting M (=4) bits of digital data to analog data. The non-volatile memory comprises a data line $DL_A$, a memory unit $MU_A$ comprising M (where $M \geq 2$, and, in the second embodiment, M=4) memory cells $MC_{AM}$, and M plate lines $PL_M$.

Each memory cell $MC_{Am}$ comprises a first electrode 41, a ferroelectric layer 42 and a second electrode 43. In the memory unit $MU_A$, the first electrode 41 is shared, and this shared first electrode 41 (may occasionally be referred to as a "common node $CN_A$") is connected to the data line $DL_A$. In addition, in the memory unit $MU_A$, the second electrode 43 of the mth (where m=1, 2, ... M) memory cell $MC_{Am}$ is connected to the mth plate line $PL_m$. In the second embodiment, a plurality of D/A converters are connected to the data line $DL_A$ and the common node $CN_A$ is connected to the data line $DL_A$ via a selection transistor $TR_A$. Where only one D/A converter is connected to the data line $DL_A$, the common node $CN_A$ may be connected directly to the data line $DL_A$.

The areas of the ferroelectric layers 42 of the memory cells $MC_{AM}$ vary among the memory cells. More specifically, the sizes of the ferroelectric layers 42 of the memory cells $MC_{AM}$ varies. Still more specifically, the widths of the plate lines $PL_M$ are kept uniform while the width of the first electrode 41 (the common node $CN_A$) is varied, but it is not limited as such. Assuming that the mth (m=1, 2, ... M) memory cell $MC_{Am}$ has an area of $A_m$, $A_m = 2^{(m-1)} A_1$ is satisfied.

One source/drain region 14A of the selection transistor $TR_A$ is connected to the data line $DL_A$ via a connection hole 35, and the other source/drain region 14B of the selection transistor $TR_A$ is connected to the shared first electrode 41 (the common node $CN_A$) via a connection hole 37, which is formed in an opening provided in an insulation layer 36. The data line $DL_A$ is connected to the write register $WR_A$ via the write-in transistor $TR_{IN-A}$, and is also connected to the sense amplifier $SA_A$ via the read-out transistor $TR_{OUT-A}$.

A word line WL for controlling the operation of the selection transistor $TR_A$, a word line $WL_{IN}$ for controlling the operation of the write-in transistor $TR_{IN-A}$, and a word line $WL_{OUT}$ for controlling the operation of the read-out transistor $TR_{OUT-A}$ are connected to a word line decoder/driver WD, and the plate line $PL_m$ is connected to the plate line decoder/driver PD. The word line WL extends in the direction perpendicular to the sheet of FIG. 5, and is shared between the selection transistor $TR_A$ of the D/A converter $DA_A$ and the selection transistor $TR_B$ of the D/A converter $DA_B$ which is adjacent to the D/A converter DAB in the direction perpendicular to the sheet of FIG. 5. The second electrode 43 of the memory cell $MC_{Am}$ of the D/A converter $DA_A$ is shared with the memory cell of the D/A converter $DA_B$ adjacent to the D/A converter $DA_A$ in the direction perpendicular to the sheet of FIG. 5. The second electrode 43 also serves as the plate line $PL_m$.

Figure 6:
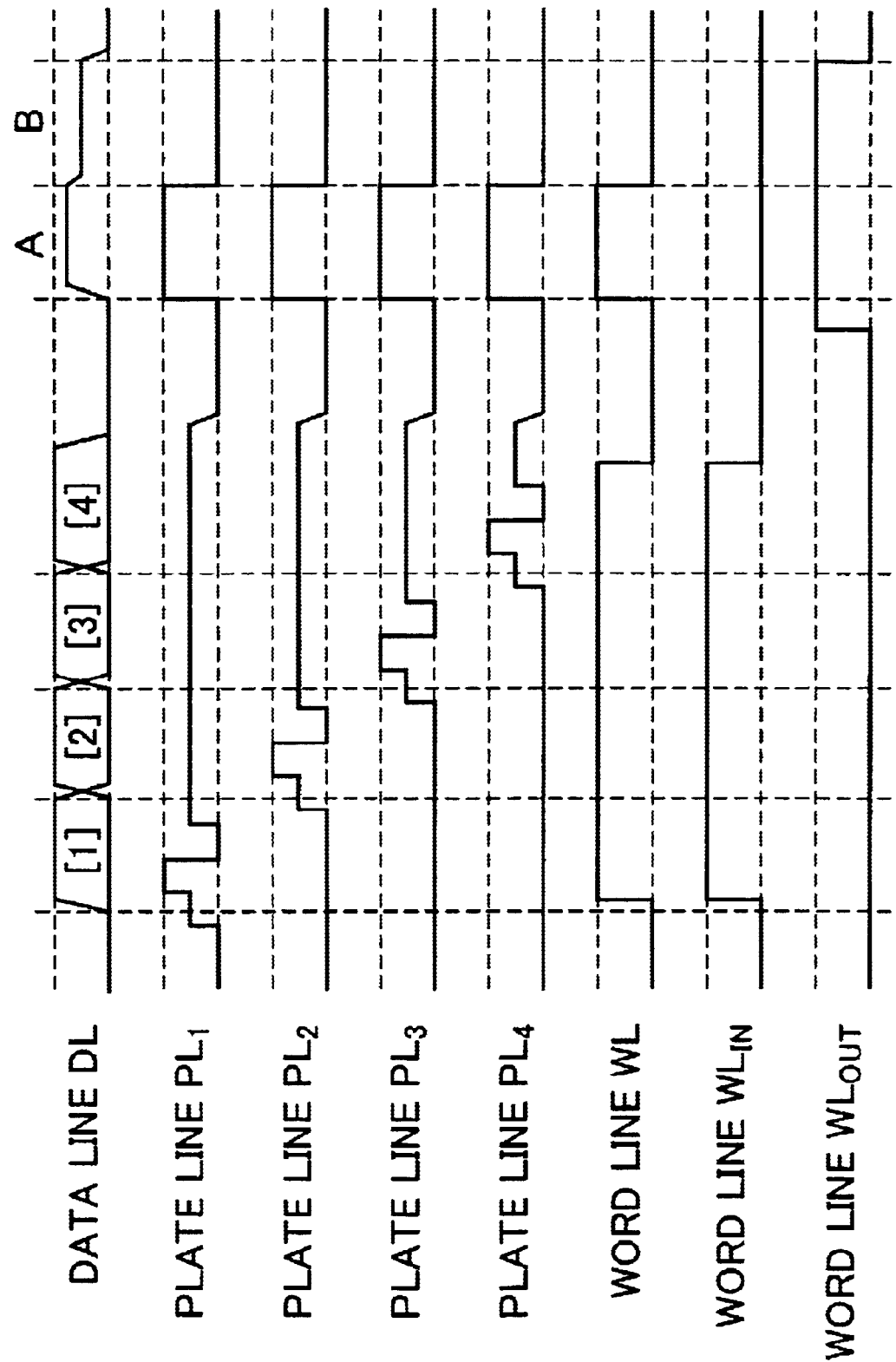
FIG. 6 is an operational waveform chart of the digital to analog converter according to the second embodiment of the present invention.

An operational sequence of the D/A converter $DA_A$ according to the second embodiment is shown in the operational waveform chart of FIG. 6. In FIG. 6, numerals in the brackets indicate that the binary data of the mth bit is written in the memory cell $MC_{Am}$ of the mth memory unit $MU_{Am}$.

In the operation of the D/A converter $DA_A$ according to the second embodiment, M bits (specifically 4 bits) of digital data are serially inputted to the write register $WR_A$, and binary data corresponding to the individual bits of the M-bit digital data is temporarily stored in the write register $WR_A$. The word line $WL_{IN}$ is then set to a high level to thereby turn the write-in transistor $TR_{IN-A}$ on, and further, the word line WL is set to a high level to thereby place the selection transistor $TR_A$ in a conductive state, the data line $DL_A$ and the plate line $PL_m$ are successively driven, and the binary data of the mth bit is written in the mth memory cell $MC_{Am}$. When the potential of the data line $DL_A$ is set to 0 volts and the potential of the plate line $PL_n$ is set to $V_{CC}$ volts, a data of "0" is written in the memory cell $MC_{AM}$. On the other hand, when the potential of the data line $DL_A$ is set to $V_{CC}$ volts and the potential of the plate line $PL_m$ is set to 0 volts, a data of "1" is written in the memory cell $MC_{AM}$. In addition, a potential of, for example, $(\frac{1}{2})_{VCC}$ volts is applied to a plate line $PL_j$ (j≠m) other than the plate line $PL_m$ so as to prevent the data already written in the memory cell $MC_j$ from being rewritten.

After a desired period has elapsed, the data line $DL_A$ is equalized to 0 volts, the word line $WL_{OUT}$ and the word line WL are set to a high level, the read-out transistor $TR_{OUT-A}$ and the selection transistor $TR_A$ are turned on, and all plate lines $PL_M$ are driven at the same time, and data is read out from all memory cells $MC_{AM}$ simultaneously. More specifically, a potential of $V_{CC}$ volts is applied to all plate lines $PL_M$. In so doing, if a data of "1" is stored in the memory cell $MC_{Am}$, polarization inversion occurs in the ferroelectric layer, the amount of accumulated charge increases, and the electric potential of the data line $DL_A$ rises. On the other hand, if a data of "0" is stored in the memory cell $MC_{Am}$, polarization inversion does not occur in the ferroelectric layer, and the electric potential of the data line $DL_A$ hardly increases. The rise in electric potential $\Delta V$ of the data line $DL_A$ can generally be expressed by equation (1) described above. The electric potential thus generated across the data line $DL_A$ (as indicated by "A" in FIG. 6) is read out by the sense amplifier $SA_A$ and is outputted. Conversion of digital data to analog data is thus achieved.

Alternatively, the electric potential of the data line (as indicated by "B" in FIG. 6), which appears under a condition in which a potential of 0 volts is applied to all the plate lines $PL_M$ after $V_{CC}$ volts are applied to all the plate lines $PL_M$, may then be read out by the sense amplifier $SA_A$ and be outputted. Or the first and second electrodes may be short-circuited after data is written in the memory cell $MC_{Am}$, and the short circuit condition may be released before the data is read out. As a result, the electric potential appearing across the data line upon read-out of the data from the memory cell $MC_{Am}$ may be stabilized.

As shown in FIG. 4, by adopting a configuration in which a plurality of D/A converters $DA_A$, $DA_B$ are juxtaposed, and the plate lines of the memory cells in the individual non-volatile memories are shared, it becomes possible to convert a large volume of digital data to analog data at high speed. In addition, by providing, for example, two D/A converter arrays, and by independently controlling the write registers and the read-out transistors, digital data may be inputted to one D/A converter array while outputting analog data from the other D/A converter array, thus enabling an even larger volume of digital data to be converted to analog data at a yet higher speed.

Figure 7:
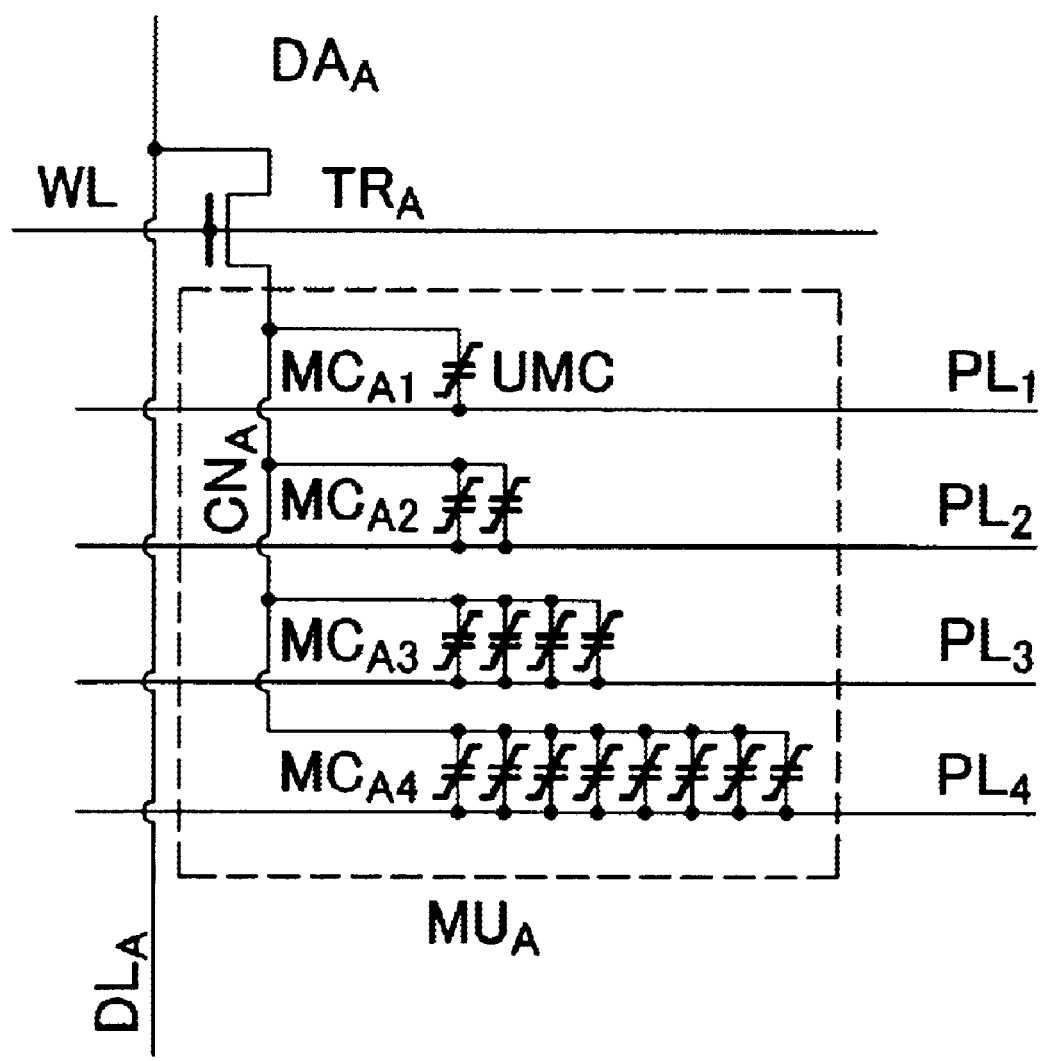
FIG. 7 is a circuit diagram of a modified example of the ferroelectric non-volatile semiconductor memory in the digital to analog converter according to the second embodiment of the present invention.

FIG. 7 shows a circuit diagram of a modified example of the D/A converter $DA_A$ according to the second embodiment. In the modified D/A converter $DA_A$, the individual memory cells comprise one or more unit memory cells UMC, where the number of unit memory cells in each of the memory cells $MC_{AM}$ is varied. The number of the unit memory cells UMC of the memory cell $MC_{Am}$ may be set to, for example, $2^{(m-1)}$. Alternatively, it may first be set to a number larger than $2_{(m-1)}$, the analog data output from the D/A converter may be measured, the number of the unit memory cells UMC may be determined, and the unnecessary unit memory cells UMC may then be eliminated. The unnecessary unit memory cells UMC may be removed by fusing, for example, a portion connecting the first electrode and the selection transistor.

The various embodiments described above are applicable to the D/A converters according to the individual embodiments described hereinafter.

Below, a method for manufacturing the non-volatile memory according to the second embodiment is described. However, the non-volatile memories according to the other embodiments or the modifications thereof may be manufactured in a substantially similar manner.

[Step-200]

First, a MOS-transistor which functions as the selection transistor $TR_A$ of the non-volatile memory is formed on the semiconductor substrate 10. In order to do so, a device isolation region 11 having a LOCOS structure is formed based on any known method. It is to be noted that the device isolation region may have a trench structure or a combination of the trench and LOCOS structures. The surface of the semiconductor substrate 10 is then oxidized by, for example, a pyrogenic process, and the gate insulating film 12 is formed. A polysilicon layer doped with impurities is formed on the entire surface by the CVD method, the polysilicon layer is patterned, and the gate electrode 13 is formed. The gate electrode 13 also serves as the word line. The gate electrode 13 may also be formed with, instead of the polysilicon layer, polycide or metal silicide. The semiconductor substrate 10 is then subjected to ion implantation, and an LDD structure is formed. Then, after an $SiO_2$ layer is formed on the entire surface by the CVD method, a gate sidewall (not shown) is formed on the side surface of the gate electrode 13 by performing an etch-back process on this $SiO_2$ layer. After ion-implantation is performed on the semiconductor substrate 10, the source/drain regions 14A and 14B are formed by performing annealing to activate the implanted impurities.

[Step-210]

After a lower insulation layer comprising $SiO_2$ is formed by the CVD method, an opening is then formed by the RIE method in the lower insulation in the upper area of the source/drain region 14A. A polysilicon layer doped with impurities is then formed by the CVD method on the lower insulation layer including the inside of the opening. Thus, the connection hole (contact plug) 35 is formed. The polysilicon layer on the lower insulation layer is patterned to form the data line $DL_A$. An upper insulation layer comprising BPSG is then formed on the entire surface by the CVD method. After the formation of the upper insulation layer comprising BPSG, it is preferable to re-flow the upper insulation layer in an atmosphere of nitrogen gas at, for example, 900° C. for 20 minutes. It is further preferable that the upper insulation layer be planarized by chemically and mechanically polishing the top surface of the upper insulation layer by a chemical-mechanical polishing (CMP) method. The lower and upper insulation layers are hereinafter collectively referred to as an insulation layer 36.

[Step-220]

Another opening is formed in the insulation layer 36 above the other source/drain region 14B by the RIE method, and the opening is filled with polysilicon doped with impurities to thereby complete the connection hole (contact plug) 37. The data line $DL_A$ extends above the lower insulation layer in a horizontal direction with respect to the drawing so as not to contact the connection hole 37.

The connection hole 37 may also be formed by filling the opening formed in the insulation layer 36 with a metal wiring material such as refractory metals and metal suicides, examples of which include tungsten, Ti, Pt, Pd, Cu, TiW, TiNW, $WSi_2$, $MoSi_2$ and so forth. The top surface of the connection hole 37 may be leveled with the insulation layer 36, or the top of the connection hole may protrude from the surface of the insulation layer 36. Examples of the process conditions for filling the opening with tungsten to form the connection hole 37 are indicated in Table 2 below. It is preferable, prior to filling the opening with tungsten, to sequentially form a Ti layer and a TiN layer on the insulation film 36, including the inside of the opening, by, for example, the magnetron sputtering method. The Ti layer and TiN layer are formed for purposes of achieving an ohmic low contact resistance, of preventing the semiconductor substrate 10 from being damaged during the blanket tungsten CVD process, and of improving the adhesion properties of the tungsten.

TABLE 2

| Sputtering conditions for the Ti layer (Thickness: 20 nm) | |
|---|---|
| Process gas: | Ar = 35 sccm |
| Pressure: | 0.52 Pa |
| RF power: | 2 kW |
| Substrate heating: | none |
| Sputtering conditions for the TiN layer (Thickness: 100 nm) | |
| Process gas: | $N_2$/Ar = 100/35 sccm |
| Pressure: | 1.0 Pa |
| RF power: | 6 kW |
| Substrate heating: | none |
| CVD conditions for tungsten | |
| Gas used: | $WF_6/H_2$/Ar = 40/400/2250 sccm |
| Pressure: | 10.7 kPa |
| Deposition temperature: | 450° C. |
| Etching conditions for the tungsten layer, the Ti layer and the TiN layer | |
| First step etching: etching of the tungsten layer | |
| Gas used: | $SF_6$/Ar/He = 110/90/5 sccm |
| Pressure: | 46 Pa |
| RF power: | 275 W |
| Second step etching: etching of the TiN/Ti layer | |
| Gas used: | Ar/$Cl_2$ = 75/5 sccm |
| Pressure: | 6.5 Pa |
| RF power: | 250 W |

[Step-230]

It is preferable to next form an adhesion layer (not shown) comprising titanium oxide on the insulation layer 36. Then, the first electrode (lower electrode) may be obtained by forming a first electrode material layer comprising Ir on the adhesion layer by, for example, sputtering, and by patterning the first electrode material layer and adhesion layer based on photolithography techniques and dry etching techniques.

[Step-240]

A ferroelectric thin-film comprising a Bi-based layered perovskite ferroelectric material (specifically, for example, $Bi_2SrTa_2O$ having a crystallization temperature of 750° C.) is formed on the entire surface, for example, by the MOCVD method. The film is then dried in air at 250° C., treated thermally in an atmosphere of oxygen gas at 750° C. for an hour to thereby promote crystallization, and is then patterned as required based on photolithography techniques and dry etching techniques to obtain the ferroelectric layers 42.

[Step-250]

Upon sequentially forming on the entire surface an $IrO_{2-X}$ layer and a Pt layer by way of a sputtering method, the Pt layer and the $IrO_{2-X}$ layer are sequentially patterned based on photolithography techniques and dry etching techniques, and the second electrodes 43 are formed. Should the etching cause damage to the ferroelectric layers 42, annealing at a temperature necessary for the recovery will be helpful.

[Step-260]

An insulation film 46A is then formed on the entire surface.

In manufacturing the non-volatile memories according to the third to sixth embodiments described hereinafter, the processes below may be performed sequentially:

formation and planarization of an interlayer insulation layer 46;

formation of an opening and a connection hole 47;

formation of a first electrode 51, ferroelectric layers 52 comprising $Bi_2Sr(Ta_{1.5}Nb_{0.5})O_9$ having a crystallization temperature of 700° C., and second electrodes 53; and formation of an insulation film 56A.

A thermal processing of the ferroelectric layers 52 comprising $Bi_2Sr(Ta_{1.5}Nb_{0.5})O_9$ for promoting crystallization may be performed in an atmosphere of oxygen gas at 700° C. for an hour.

The second electrodes do not have to serve as the plate lines. In this case, once the formation of the insulation films 46A, 56A is complete, the second electrodes 43, 53 may be connected by the connection hole (via-hole), while the plate lines are formed on the insulation films 46A, 56A such that they are connected to the connection hole.

Examples of conditions for forming the ferroelectric thin-film comprising $Bi_2SrTa_2O_9$ are shown in Table 3 below. In Table 3, "thd" is an abbreviation for tetramethyl-heptanedionate. The source materials shown in Table 3 are dissolved in a solvent containing tetrahydrofuran (THF) as a major component.

TABLE 3

| Formation by MOCVD | |
|---|---|
| Source materials: | $Sr(thd)_2$-tetraglyme |
| | $Bi(C_6H_5)_3$ |
| | $Ta(O-iC_3H_7)_4(thd)$ |
| Formation temperature: | 400 to 700° C. |
| Process gas: | Ar/$O_2$ = 1000/1000 $cm^3$ |
| Formation speed: | 5 to 20 nm/min |

The ferroelectric thin-film comprising $Bi_2SrTa_2O_9$ may also be formed on the entire surface by the pulse laser ablation method, sol-gel method, or RF sputtering method. Conditions of formation by these processes are shown below. In forming a thick ferroelectric thin-film by the sol-gel process, spin coating and drying, or spin coating and sintering (or annealing) may be repeated a desired number of times.

TABLE 4

Formation by the pulse laser ablation method

| | |
|---|---|
| Target: | $Bi_2SrTa_2O_9$ |
| Laser: | KrF excimer laser (wavelength = 248 nm, pulse width = 25 nsec, 5 Hz) |
| Formation temperature: | 400 to 800° C. |
| Oxygen concentration: | 3 Pa |

TABLE 5

Formation by the sol-gel method

| | |
|---|---|
| Source materials: | bismuth 2-ethylhexanoic acid [$Bi(CH_3(CH_2)_3CH(C_2H_5)COO)_3$, abbr. $Bi(OOc)_3$] strontium 2-ethylhexanoic acid [$Sr(CH_3(CH_2)_3CH(C_2H_5)COO)_2$, abbr. $Sr(OOc)_2$] tantalum ethoxide [$Ta(OEt)_5$] |
| Spin coating conditions: | 3,000 rpm × 20 sec |
| Drying: | 250° C., 7 min |
| Sintering: | 700 to 800°, 1 h |

(RTA process is added as required)

TABLE 6

Formation by the RF sputtering method

| | |
|---|---|
| Target: | $Bi_2SrTa_2O_9$ ceramic target |
| RF power: | 1.2 to 2.0 W/cm² target |
| Pressure: | 0.2 to 1.3 Pa |
| Formation temperature: | room temperature to 600° C. |
| Process gas: | $Ar/O_2$ = 2/1 to 9/1 (ratio of flow rate) |

Examples of the conditions for forming PZT or PZLT by the magnetron sputtering method in forming the ferroelectric layer with PZT or PLZT are shown in Table 7 below. PZT or PLZT may also be formed by the reactive sputtering method, electron beam deposition method, sol-gel method or MOCVD method.

TABLE 7

| | |
|---|---|
| Target: | PZT or PLZT |
| Process gas: | $Ar/O_2$ = 90 vol %/10 vol % |
| Pressure: | 4 Pa |
| Power: | 50 W |
| Formation temperature: | 500° C. |

Moreover, it is also possible to form PZT or PLZT by the pulse laser ablation method, examples of conditions for which are shown in Table 8 below.

TABLE 8

| | |
|---|---|
| Target: | PZT or PLZT |
| Laser: | KrF excimer laser (wavelength = 248 nm, pulse width = 25 nsec, 3 Hz) |
| Output energy: | 400 mJ (1.1 J/cm²) |
| Formation temperature: | 550 to 600° C. |
| Oxygen concentration: | 40 to 120 Pa |

(Third Embodiment)

Figure 8:
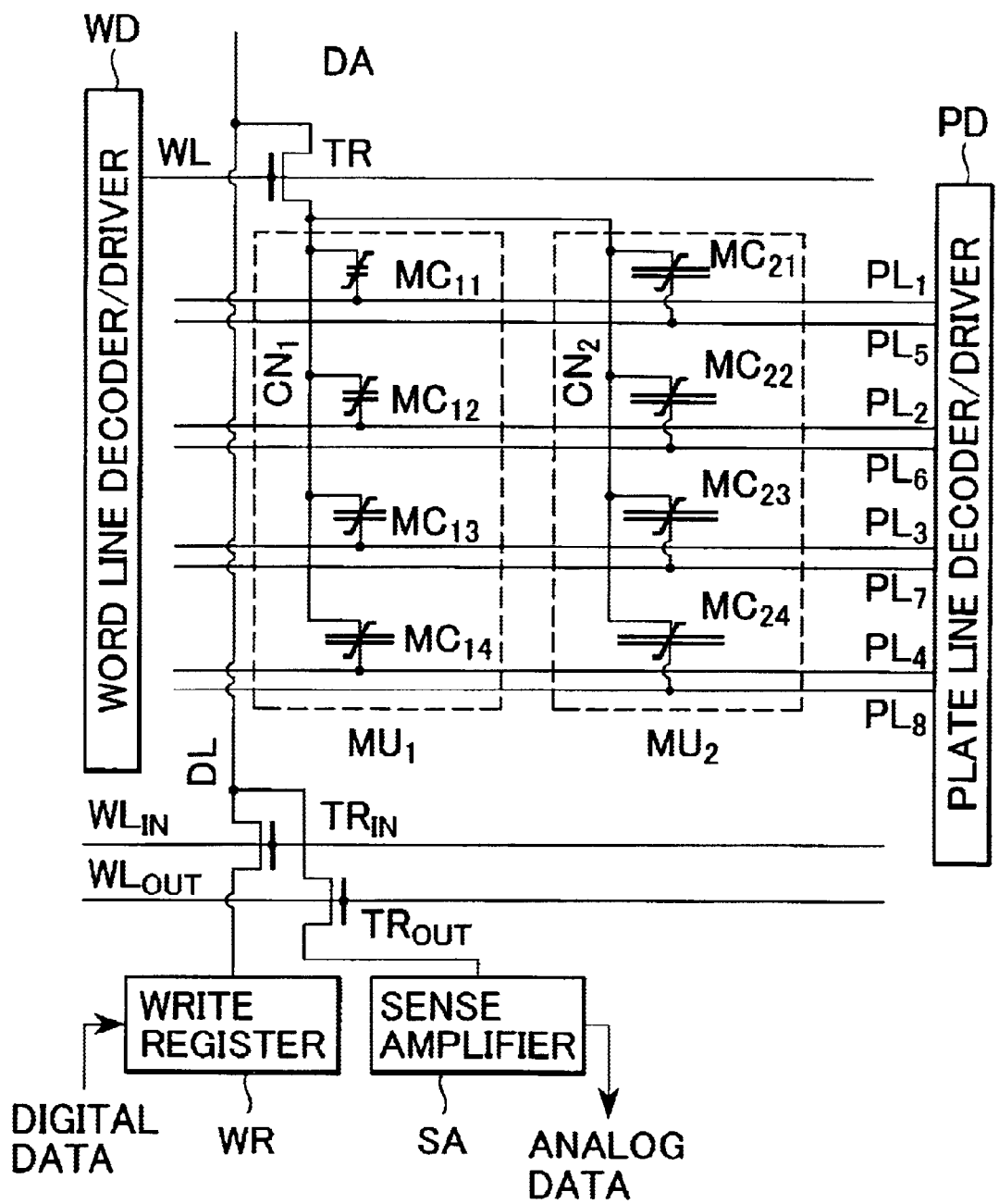
FIG. 8 is a circuit diagram of a digital to analog converter according to a third embodiment of the present invention.
Figure 9:
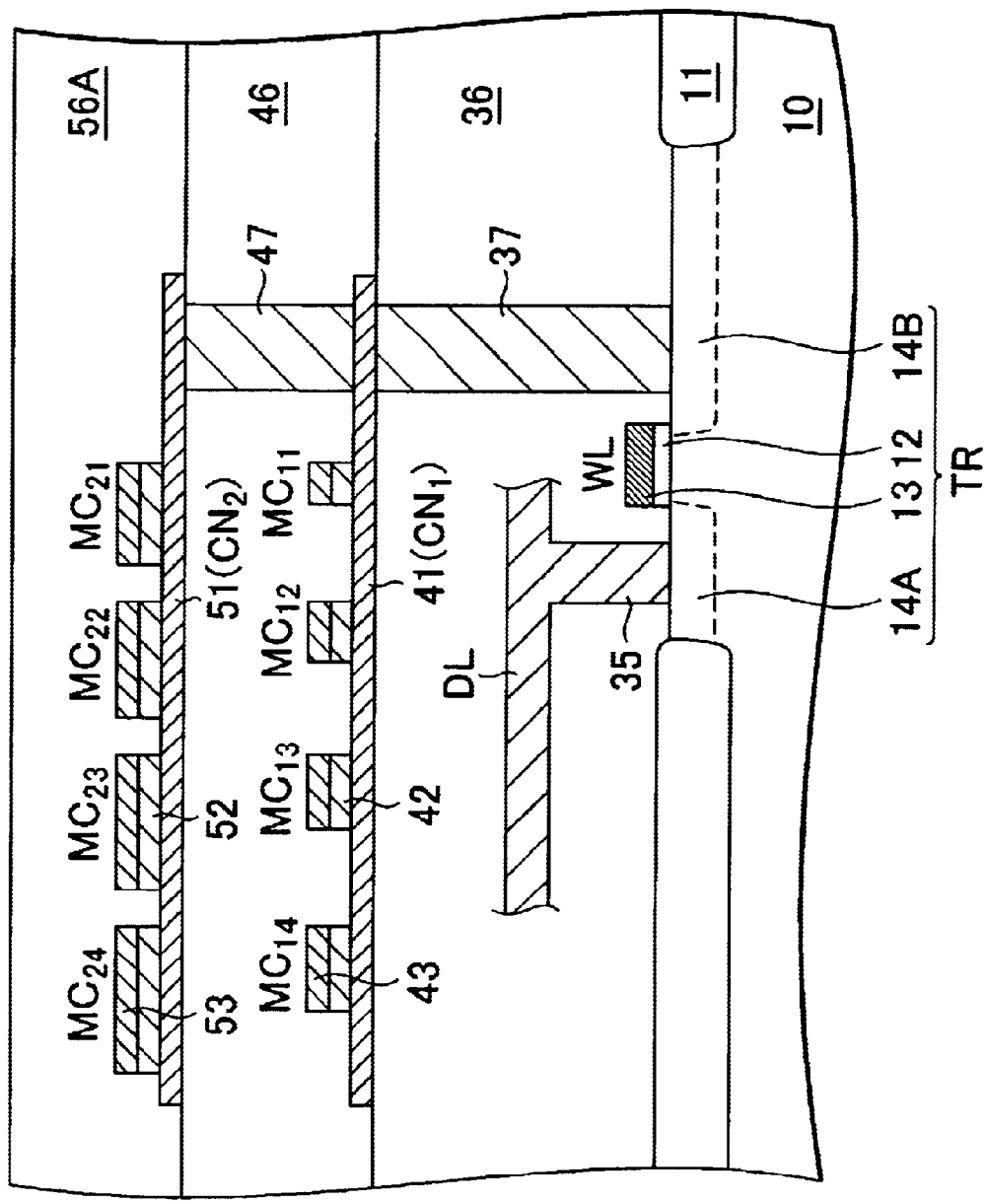
FIG. 9 is a schematic sectional view of a ferroelectric non-volatile semiconductor memory in the digital to analog converter according to the third embodiment of the invention.

The third embodiment relates to a D/A converter according to the third aspect of the present invention, and a method of D/A conversion according to the third aspect of the present invention. A circuit diagram of the D/A converter according to the third embodiment is shown in FIG. 8, and a schematic sectional view of a non-volatile memory in this D/A converter is shown in FIG. 9.

The D/A converter DA according to the third embodiment also comprises a non-volatile memory, and is designed for converting M×N (=8) bits of digital data to analog data. The non-volatile memory comprises a data line DL, N (where, N≧2, and, in the third embodiment, N=2) memory units $MU_N$ individually comprising M (where M≧2, and, in the third embodiment, M=4) memory cells $MC_{mM}$, and M×N plate lines.

The N memory units $MU_N$ are layered with an insulation layer (referred to as an inter-layer insulation layer 46 for convenience) in between each. Each memory cell comprises first electrodes 41, 51, ferroelectric layers 42, 52, and second electrodes 43, 53. In the memory unit $Mu_n$, the first electrode of the memory cells $MC_{nM}$ is shared, and the shared first electrode is connected to the data line DL via a selection transistor TR. More specifically, in the memory unit $MU_1$, the first electrode 41 of the memory cell $MC_{1M}$ is shared (this shared first electrode will be referred to as a first common node $CN_1$), and the shared first electrode 41 (the first common node $CN_1$) is connected to the data line DL via the selection transistor TR. In the memory unit $MU_2$, the first electrode 51 of the memory cells $MC_{2M}$ is shared (this shared first electrode will be referred to as a second common node $CN_2$), and the shared first electrode 51 (the second common node $CN_2$) is connected to the data line DL via the selection transistor TR. In addition, in the nth (where n=1, 2, . . . N) memory unit $MU_n$, the second electrodes 43, 53 of the mth (where m=1, 2, . . . M) memory cell $MC_{nm}$ are connected to the [(n−1)M+m]th plate line $PL_{(n-1)M+m}$. The plate line $PL_{(n-1)M+m}$ is also connected to the second electrodes 43, 53 of the individual memory cells of the non-volatile memory in other D/A converters. More specifically, in the third embodiment, the individual plate lines are extended from the second electrodes 43, 53. In the third embodiment, a plurality of D/A converters are connected to the data line DL, and the common nodes $CN_1$, $CN_2$ are connected to the data line DL via the selection transistor TR. For the case where only a single D/A converter is connected to the data line DL, the common nodes $CN_1$, $CN_2$ may directly be connected to the data line DL.

The areas of the ferroelectric layers 42, 52 of the memory cells $MC_{NM}$ vary among the memory cells. More specifically, the sizes of the ferroelectric layers 42, 52 of the memory cells $MC_{NM}$ vary. Still more specifically, the widths of the plate lines $PL_M$ is kept uniform while the widths of the first electrodes 41, 51 (the common nodes $CN_N$) are varied, but it is not limited as such. Assuming that the mth (m=1, 2, . . . M) memory cell $MC_{nm}$ of the memory unit $MU_n$ of the nth layer has an area of $A_{nm}$, $A_{nm}=2^{((n-1)M+(m-1))}A_{11}$ is satisfied.

One source/drain region 14A of the selection transistor TR is connected to the data line DL via the connection hole 35, and another source/drain region 14B of the selection transistor TR is connected to the shared first electrode 41 (the first common node $CN_1$) of the memory unit $MU_1$ of the first layer via a connection hole 37 provided in an insulation layer 36. Further, the other source/drain region 14B of the selection transistor TR is connected to the shared first electrode 51 (the second common node $CN_2$) of the memory unit $MU_2$ of the second layer via the connection hole 37 provided in the insulation layer 36 and a connection hole 47 provided in the inter-layer insulation layer 46. Reference numeral 56A in the figure represents an insulation film.

The data line DL is connected to the write register WR via the write-in transistor $TR_{IN}$, and is further connected to the sense amplifier SA via the read-out transistor $TR_{OUT}$. The plate line $PL_{(n-1)M+m}$ is connected to a plate line decoder/driver PD. A word line WL, a word line $WL_{IN}$ for controlling the operation of a write transistor $TR_{IN}$, and a word line $WL_{OUT}$ for controlling the operation of a read-out transistor TROUT are connected to a word line decoder/driver WD. The word line WL extends in the direction perpendicular to the sheet of FIG. 9. The second electrode 43 of the memory cell $MC_{1m}$ of the D/A converter DA is shared with the second electrode of a memory cell of a D/A converter DA adjacent in the direction perpendicular to the sheet of FIG. 9, and also serves as the plate line $PL_{(n-1)M+m}$. The second electrode 53 of the memory cell $MC_{2m}$ of the D/A converter DA is shared with the second electrode of a memory cell of a D/A converter adjacent in the direction perpendicular to the sheet of FIG. 9, and also serves as the plate line $PL_{(n-1)M+m}$. The word line WL is shared by the selection transistor TR of the D/A converter DA and the selection transistor of the D/A converter adjacent in the direction perpendicular to the sheet of FIG. 9.

In the operation of the D/A converter DA according to the third embodiment, M×N bits (specifically, M×N=8 bits) of digital data are serially inputted to the write register WR, and binary data corresponding to the individual bits of the M×N-bit digital data is temporarily stored in the write register WR. The word line $WL_{IN}$ is then set to a high level to thereby turn the write-in transistor $TR_{IN}$ on, the word line WL is set to a high level to thereby place the selection transistor TR in a conductive state, and the data line DL and the plate line $PL_{(n-1)M+m}$ are successively driven so as to write the binary data of the [(n−1)M+m]th bit in the mth memory cell $MC_{nm}$ in the memory unit $MU_n$ of the nth layer. If the potential of the data line DL is set to 0 volts and the potential of the plate line $PL_{(n-1)M+m}$ is set to $V_{CC}$ volts, a data of 0 is written in the memory cell $MC_{nm}$. On the other hand, if the potential of the data line DL is set to $V_{CC}$ volts and the potential of the plate line $PL_{(n-1)M+m}$ is set to 0 volts, a data of "1" is written in the memory cell $MC_{nm}$. A potential of, for example, $(\frac{1}{2})V_{CC}$ volts is applied to the plate line $PL_j$ (j≠(n−1)M+m) other than the plate line $PL_{(n-1)M+m}$ so as to prevent the data already written in the memory cell $MC_j$ from being rewritten.

After a desired period has elapsed, the data line DL is equalized to 0 volts, the word line $WL_{OUT}$ and the word line WL are set to a high level to turn the read-out transistor $TR_{OUT}$ and the selection transistor TR on, and all the plate lines $PL_M$ are driven simultaneously to thereby read out data from all the memory cells $MC_{NM}$ at the same time. More specifically, VCC volts are applied to all the plate lines $PL_M$. When the memory cell $MC_{nm}$ has a data of "1" stored therein, polarization inversion will occur in the ferroelectric layer, which results in an increase in the amount of accumulated charge and a rise in the electric potential across the data line DL. On the other hand, when the memory cell $MC_{nm}$ has a data of "0" stored therein, polarization inversion does not occur in the ferroelectric layer, and the electric potential across the data line DL hardly increases. The rise in the electric potential ΔV across the data line DL can generally be expressed by equation (1) described above. The electric potential thus generated across the data line DL is read out by the sense amplifier SA and is outputted externally. Thus, conversion of digital data to analog data may be achieved.

(Fourth Embodiment)

Figure 10:
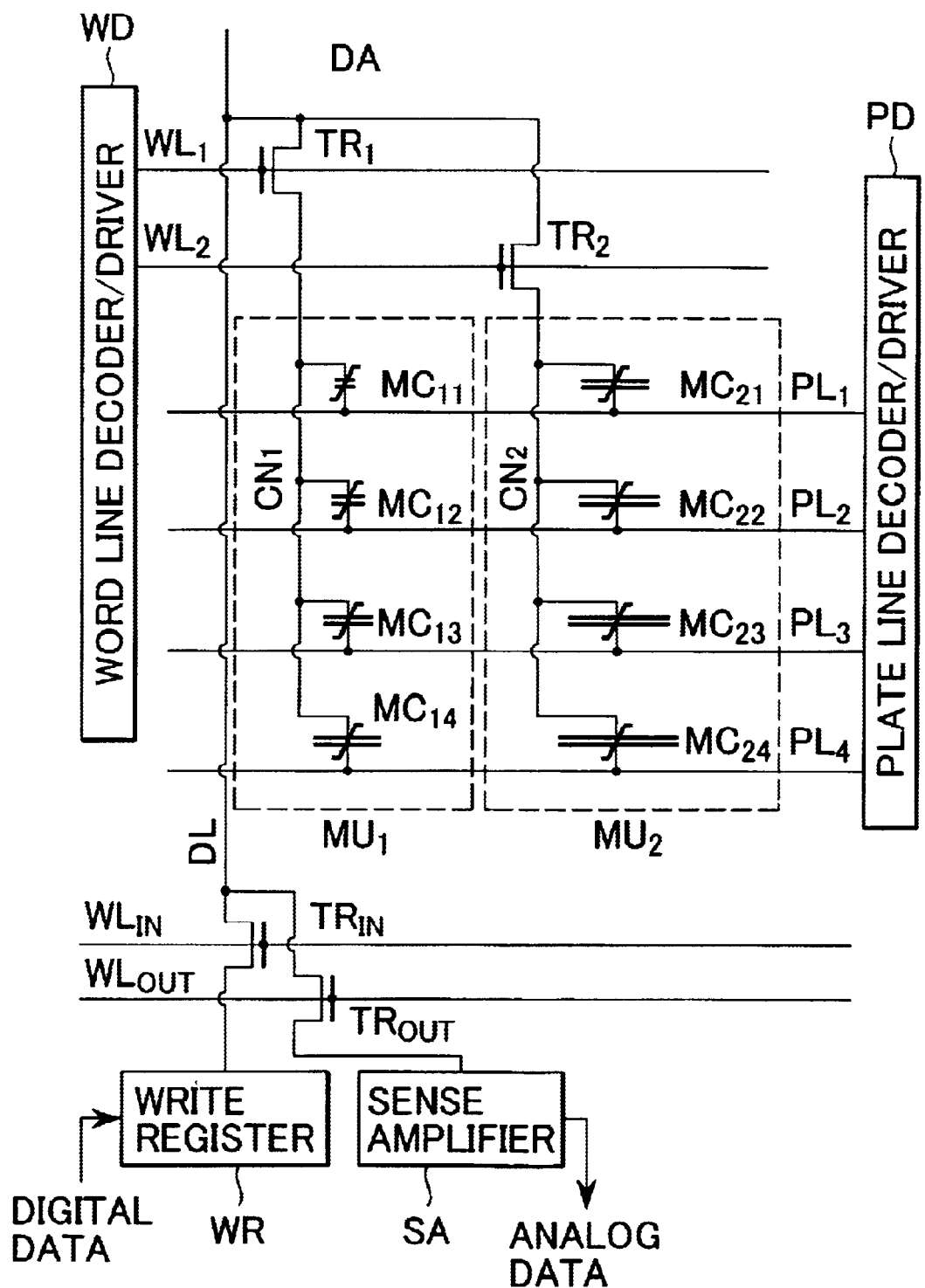
FIG. 10 is a circuit diagram of a digital to analog converter according to a fourth embodiment of the present invention.
Figure 11:
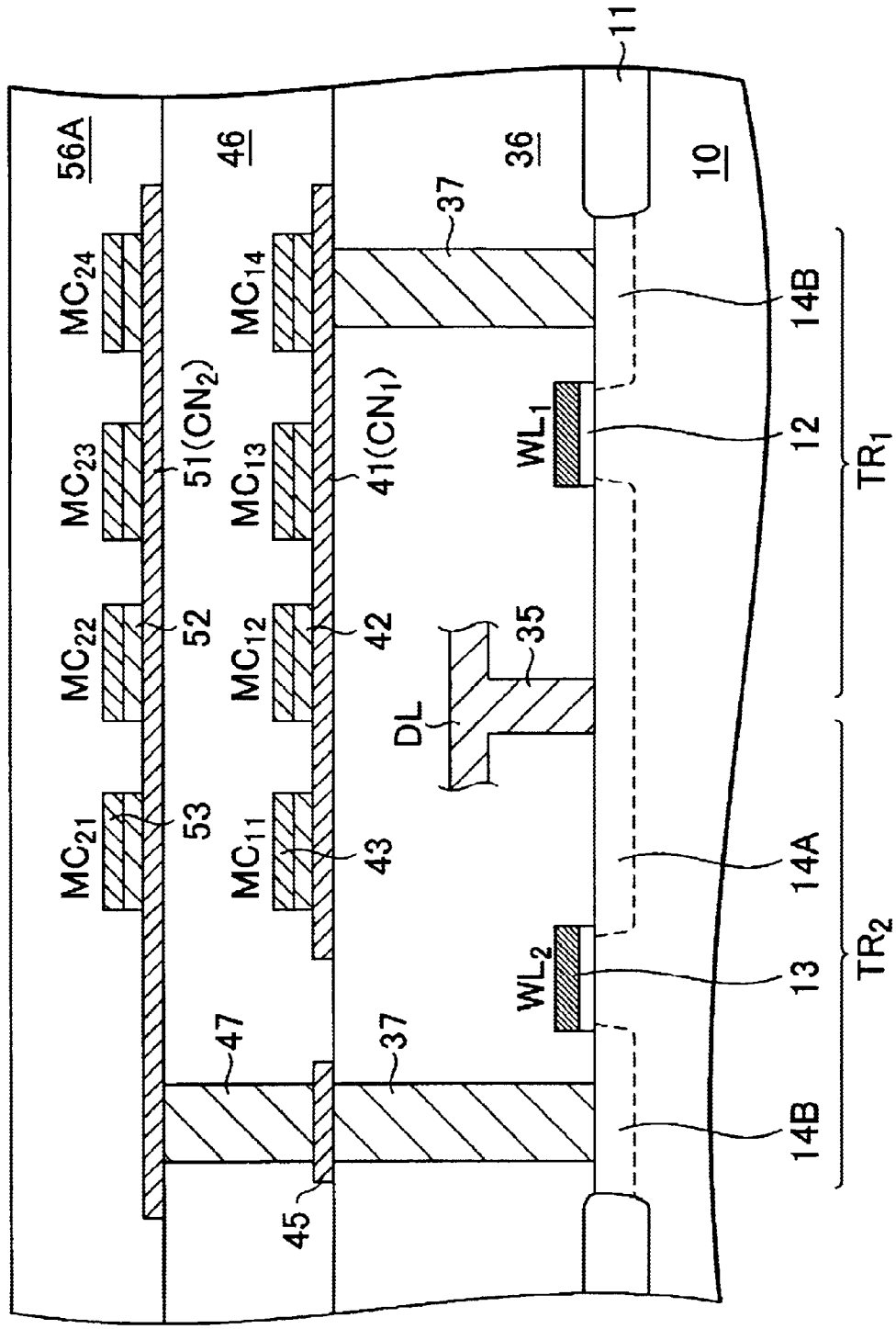
FIG. 11 is a schematic sectional view of a ferroelectric non-volatile semiconductor memory in the digital to analog converter according to the fourth embodiment of the present invention.

The fourth embodiment relates to a D/A converter according to the fourth aspect of the present invention, and a method of D/A conversion according to the fourth aspect of the present invention. A circuit diagram of the D/A converter according to the fourth embodiment is shown in FIG. 10, and a schematic sectional view of a non-volatile memory of the D/A converter is shown in FIG. 11.

The D/A converter DA according to the fourth embodiment also comprises a non-volatile memory, and is designed to convert M (=4) bits of digital data to analog data. The non-volatile memory comprises a data line DL, N (where N≧2, and, in the fourth embodiment, N=2) selection transistors $TR_N$, N memory units $MU_N$ individually comprising M (where M≧2, and, in the fourth embodiment, M=4) memory cells $MC_{NM}$, and M plate lines $PL_M$.

The N memory units $MU_N$ are layered with an insulation layer (an inter-layer insulation film 46) in between each. Each memory cell comprises first electrodes 41, 51, ferroelectric layers 42, 52, and second electrodes 43, 53. The first electrode of the memory cells $MC_{nM}$ is shared in the memory unit $MU_n$. The shared first electrode in the nth (where n=1, 2, . . . N; hereinafter referred to as the nth layer) memory unit $MU_n$ is connected to the data line DL via the nth selection transistor $TR_n$. More specifically, in the memory unit $MU_1$ of the first layer, the first electrode 41 of the memory cells $MC_{1M}$ is shared (this shared first electrode will be referred to as a first common node $CN_1$), and the shared first electrode 41 (the first common node $CN_1$) is connected to the data line DL via the first selection transistor $TR_1$. In the memory unit $MU_2$ of the second layer, the first electrode 51 of the memory cells $MC_{2M}$ is shared (this shared first electrode will be referred to as a second common node $CN_2$), and the shared first electrode 51 (the second common node $CN_2$) is connected to the data line DL via the second selection transistor $TR_2$. Similarly, in the memory unit $MU_n$ of the nth (where n=1, 2, . . . N) layer, the second electrode 43 or 53 of the mth (where m=1, 2, . . . M) memory cell $MC_{nm}$ is connected to the mth plate line $PL_m$ shared between the memory units $MU_N$. The plate line $PL_m$ is also connected to the second electrodes 43, 53 of the individual memory cells of the non-volatile memory in other D/A converters. More specifically, in the fourth embodiment, the individual plate lines are extended from the second electrodes 43, 53. The individual plate lines $PL_m$ are connected in a region not shown in the drawing.

The areas of the ferroelectric layers 42, 52 of the memory cells $MC_{NM}$ vary among the memory cells. More specifically, the sizes of the ferroelectric layers 42, 52 of the memory cell $MC_{NM}$ vary. Still more specifically, the widths of the first electrodes 41, 51 (the common nodes CNN) are kept uniform while the widths of the plate lines $PL_M$ are varied, but it is not limited as such. Assuming that the mth (m=1, 2, . . . M) memory cell $MC_{nm}$ in the memory unit $MU_n$ of the nth layer has an area of $A_{nm}$, $A_{nm}=2^{(m-1)}A_{n1}$ is satisfied.

One source/drain region 14A of the selection transistors $TR_1$, $TR_2$ is connected to the data line DL via a connection hole 35, and another source/drain region 14B of the first selection transistor $TR_1$ is connected to the shared first electrode 41 (the first common node $CN_1$) of the memory unit $MU_1$ of the first layer via a connection hole 37 provided in an insulation layer 36. The other source/drain region 14B of the second selection transistor $TR_2$ is connected to the shared first electrode 51 (the second common node $CN_2$) in the memory unit $MU_2$ of the second layer via the connection hole 37 provided in the insulation layer 36, a pad portion 45 provided on the insulation layer 36, and a connection hole 47 provided in the inter-layer insulation layer 46. Reference numeral 56A in the figure represents an insulation film.

The data line DL is connected to the write register WR via a write-in transistor $TR_{IN}$, and is further connected to a sense amplifier SA via a read-out transistor $TR_{OUT}$. The plate line $PL_m$ is connected to a plate line decoder/driver PD. Word lines $WL_1$, $WL_2$, a word line $WL_{IN}$ for controlling the operation of the write-in transistor $TR_{IN}$, and a word line $WL_{OUT}$ for controlling the operation of the read-out transistor $TR_{OUT}$ are connected to a word line decoder/driver WD. The word lines $WL_1$, $WL_2$ extend in a direction perpendicular to the sheet of FIG. 11. The second electrode 43 of the memory cells $MC_{1m}$ of the D/A converter DA is shared with the a memory cell of a D/A converter adjacent in a direction perpendicular to the sheet of FIG. 11, and also serves as the plate line $PL_m$. The second electrode 53 of the memory cell $MC_{2m}$ of the D/A converter DA is shared with a memory cell of a D/A converter adjacent in a direction perpendicular to the sheet of FIG. 11, and also serves as the plate line $PL_m$. The word lines $WL_1$, $WL_2$ are shared by the selection transistors $TR_1$, $TR_2$ of the D/A converter DA and selection transistors of the D/A converter adjacent in a direction perpendicular to the sheet of FIG. 11.

In the D/A converter DA according to the fourth embodiment, M (=4) bits of digital data are converted to analog data by the memory unit $MU_1$ of the first layer, and M(=4) bits of digital data are converted to analog data by the memory unit $MU_2$ of the second layer.

In the operation of the D/A converter DA according to the fourth embodiment, M (=4) bits of digital data are serially inputted to the write register WR, and binary data corresponding to the individual bits of the M-bit digital data is temporarily stored in the write register WR. The word line $WL_{IN}$ is then set to a high level to thereby turn the write-in transistor $TR_{IN}$ on, the word line $WL_1$ is set to a high level to thereby place the selection transistor $TR_1$ in a conductive state, and the data line DL and the plate line $PL_m$ are successively driven so as to write the binary data of the mth bit in the mth memory cell $MC_{1m}$ in the memory unit $MU_1$ of the first layer. If the potential of the data line DL is set to 0 volts and the potential of the plate line $PL_m$ is set to $V_{CC}$ volts, a data "0" is written in the memory cell $MC_{1m}$. On the other hand, if the potential of the data line DL is set to $V_{CC}$ volts and the potential of the plate line $PL_m$ is set to 0 volts, a data of "1" is written in the memory cell $MC_{1m}$. A potential of, for example, $(\frac{1}{2})V_{CC}$ volts is applied to the plate line $PL_j$ (j≠m) other than the plate line $PL_m$, so as to prevent the data already written in the memory cell $MC_j$ from being rewritten.

After a desired time has elapsed, the data line DL is equalized to 0 volts, the word line $WL_{OUT}$ is set to a high level to thereby turn the read-out transistor $TR_{OUT}$ on, further, the word line $WL_1$, for example, is set to a high level to place the selection transistor $TR_1$ in a conductive state, all plate lines $PL_M$ are driven at the same time, and data is read out from all memory cells $MC_{NM}$ simultaneously. More specifically, $V_{CC}$ volts are applied to all plate lines $PL_M$. If, at this point, a data of "1" is stored in the memory cell $MC_{1m}$, polarization inversion will occur in the ferroelectric layer, which results in an increase in the amount of accumulated charge, and a rise in the electric potential across the data line DL. On the other hand, if a data of "0" is stored in the memory cell $MC_{1m}$, polarization inversion does not occur in the ferroelectric layer, and the electric potential across the data line DL hardly increases. The rise in electric potential $\Delta V$ across the data line DL can generally be expressed by equation (1) described above. The electric potential thus generated across the data line DL is then read out by the sense amplifier SA and is outputted externally. Conversion of digital data to analog data may thus be achieved.

(Fifth Embodiment)

The fifth embodiment relates to a method of D/A conversion according to the fifth aspect of the present invention. The D/A converter according to the fifth embodiment will not be detailed since its configuration may be made similar to that of the D/A converter described in the fourth embodiment except in that, in the ferroelectric layers 42, 52 of the memory cells $MC_{NM}$, assuming that the area of the mth (m=1, 2, ... M) memory cell $MC_{nm}$ of the nth layer is $A_{nm}$, $A_{nm}=2^{((n-1)M+(m-1))}A_{11}$ is satisfied, and in that the D/A converter is designed to convert M×N bits of digital data to analog data.

In the operation of the D/A converter DA according to the fifth embodiment having such a configuration, M×N bits (specifically 8 bits) of digital data are serially inputted to the write register WR, and binary data corresponding to the individual bits of the M×N-bit digital data is temporarily stored. The word line $WL_{IN}$ is then set to a high level to thereby turn the write transistor $TR_{IN}$ on, the word line $WL_1$ is set to a high level to thereby place the selection transistor $TR_1$ in a conductive state, the data line DL and the plate line $PL_m$ are successively driven, and the binary data of the [(n−1)M+m]th bit is written in the mth memory cell $MC_{1m}$ of the first layer. Then, the word line $WL_1$ is set to a low level, the word line $WL_2$ is set to a high level, setting the selection transistor $TR_2$ to a conductive state, the data line DL and the plate line $PL_m$ are successively driven, and the binary data of the [(n−1)M+m]th bit is written in the mth memory cell $MC_{2m}$ of the second layer.

After a desired period has elapsed, the data line DL is equalized to 0 volts, the word line $WL_{OUT}$ is set to a high level to thereby turn the read-out transistor $TR_{OUT}$ on, further, all word lines $WL_1$, $WL_2$, for example, are set to a high level to place all selection transistors $TR_1$, $TR_2$ in a conductive state, all plate lines $PL_M$ are driven at the same time, and data is simultaneously read out from all memory cells $MC_{NM}$. The rise in electric potential $\Delta V$ across the data line DL can generally be expressed by equation (1) described above. The electric potential thus generated across the data line DL is read out by the sense amplifier SA and is outputted externally. Conversion of the M×N-bit digital data to analog data may thus be achieved.

(Sixth Embodiment)

Figure 12:
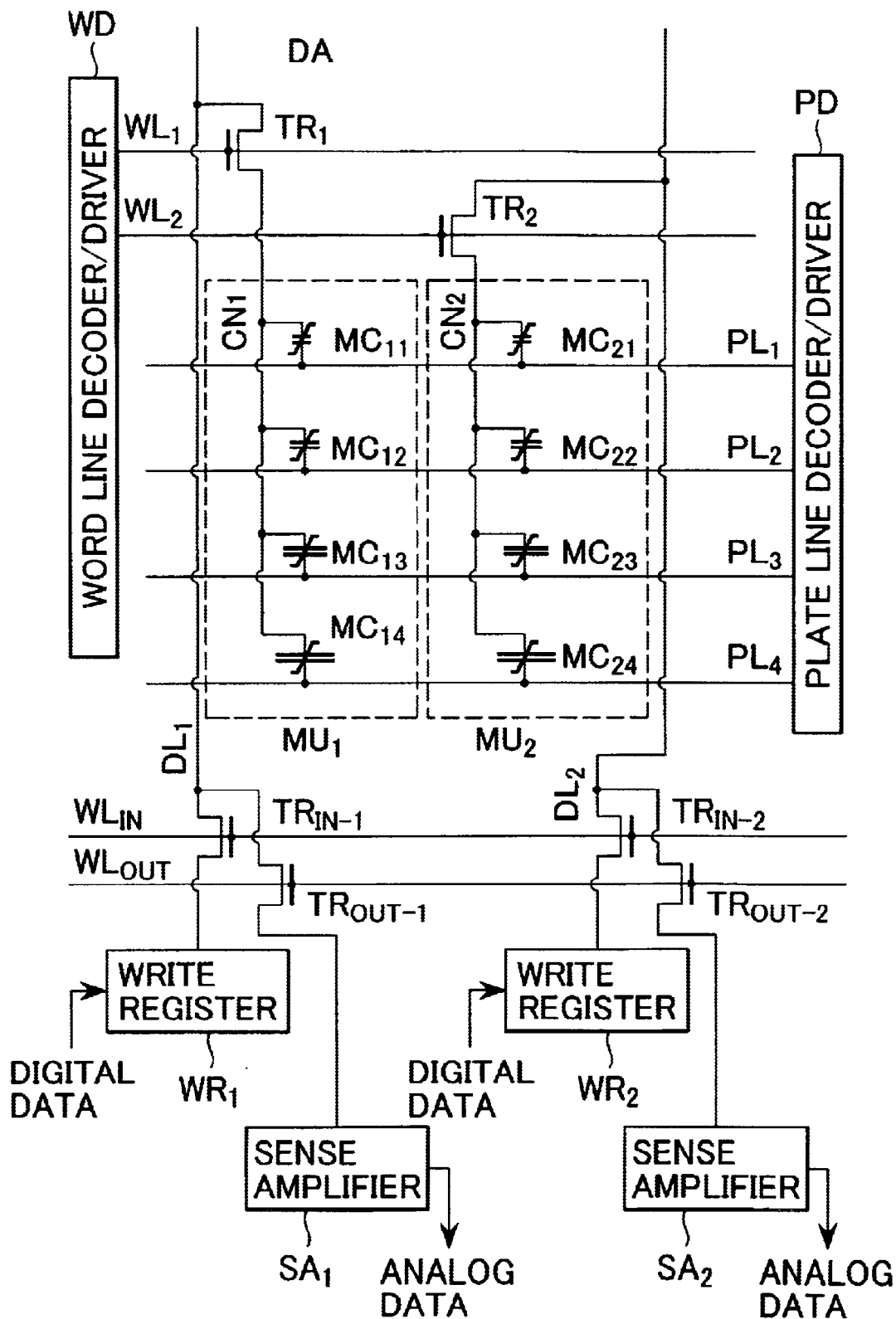
FIG. 12 is a circuit diagram of a digital to analog converter according to a sixth embodiment of the present invention.
Figure 13:
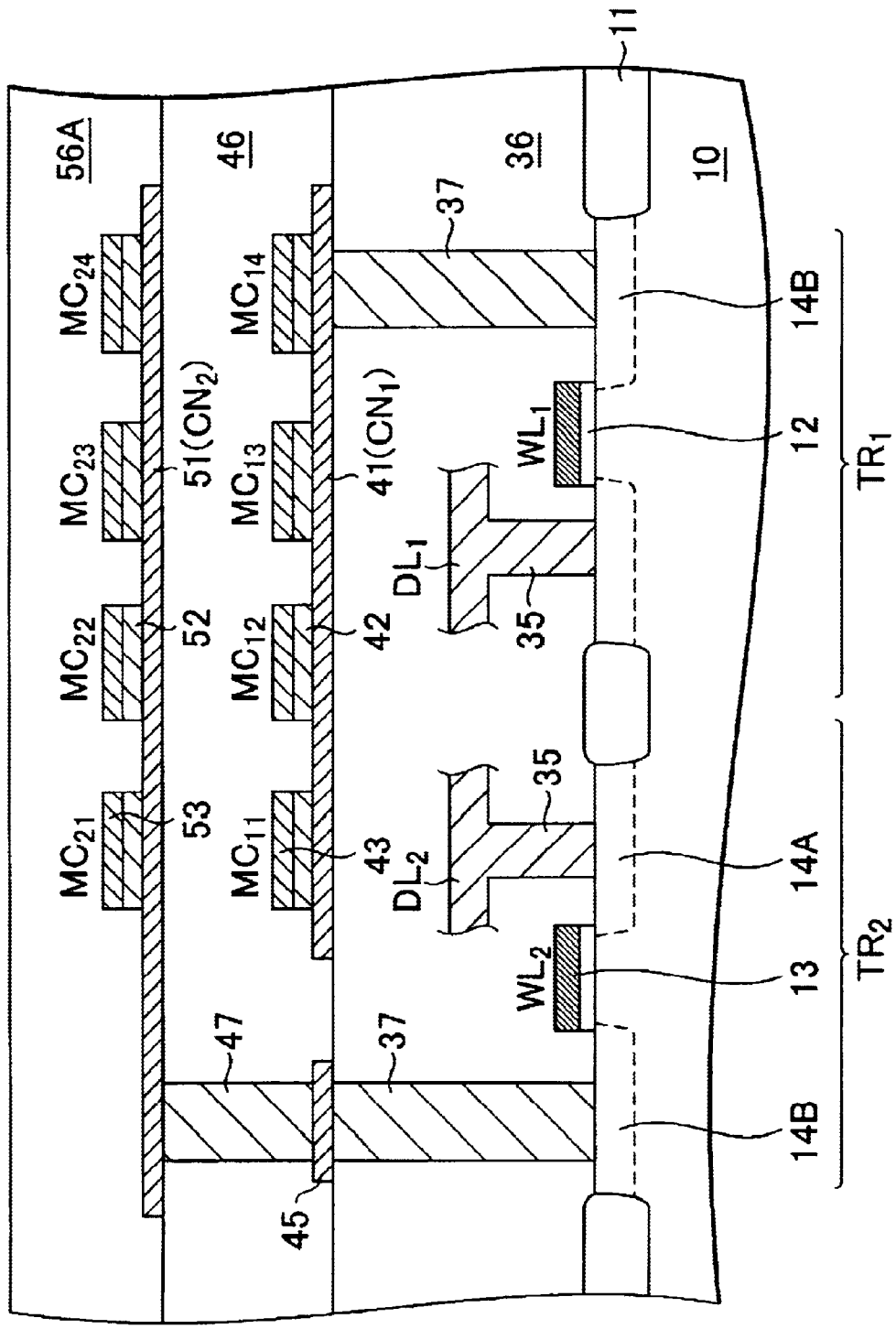
FIG. 13 is a schematic sectional view of a ferroelectric non-volatile semiconductor memory in the digital to analog converter according to the sixth embodiment of the present invention.

The sixth embodiment relates to a D/A converter according to the fifth aspect of the present invention, and a method of D/A conversion according to the sixth aspect of the present invention. A circuit diagram of the D/A converter according to the sixth embodiment is shown in FIG. 12, and a schematic sectional view of a non-volatile memory of the D/A converter is shown in FIG. 13.

The D/A converter DA according to the sixth embodiment also comprises a non-volatile memory, and is designed to convert M (=4) bits of digital data to analog data. The non-volatile memory comprises N (where N≧2, and, in the sixth embodiment, N=2) data lines $DL_N$, N selection transistors $TR_N$, N memory units $MU_N$ individually comprising M (where M≧2, and, in the sixth embodiment, M=4) memory cells $MC_{nM}$, and M plate lines $PL_M$.

N memory units $MU_N$ are layered with an insulation layer (inter-layer insulation film 46) in between each, and each memory cell comprises first electrodes 41, 51, ferroelectric layers 42, 52, and second electrodes 43, 53. The first electrode of the memory cells $MC_{nM}$ is shared in the memory unit $MU_n$, and the shared first electrode of the memory unit $MU_n$, of the nth (where n=1, 2, ... N) layer is connected to the nth data line $DL_n$ via the nth selection transistor $TR_n$. More specifically, the first electrode 41 of the memory cells $MC_{1M}$ is shared (this shared first electrode will be referred to as a first common node $CN_1$) in the memory unit $MU_1$ of the first layer, and the shared first electrode 41 (the first common node $CN_1$) is connected to the first data line $DL_1$ via the first selection transistor $TR_1$. In the memory unit $MU_2$ of the second layer, the first electrode 51 of the memory cells $MC_{2H}$ is shared (this shared first electrode will be referred to as a second common node $CN_2$), and the shared first electrode 51 (the second common node $CN_2$) is connected to the second data line $DL_2$ via the second selection transistor $TR_2$. Similarly, in the memory unit $MU_n$ of the nth (where n=1, 2, ... N) layer, the second electrode 43 or 53 of the mth (where m=1, 2, ... M) memory cell $MC_{nm}$ is connected to the mth plate line $PL_m$ which is shared among the memory units $MU_N$. The plate line $PL_m$ is also connected to the second electrodes 43, 53 of the individual memory cells of the non-volatile memory in other D/A converters. More specifically, in the sixth embodiment, the individual plate lines are extended from the second electrodes 43, 53. The individual plate lines $PL_m$ are connected in a region not shown in the drawing.

The areas of the ferroelectric layers 42, 52 of the memory cells $MC_{NM}$ differ among the memory cells. More specifically, the sizes of the ferroelectric layers 42, 52 of the memory cells $MC_{NM}$ vary. Still more specifically, the widths of the first electrodes 41, 51 (the common nodes $CN_N$) are kept uniform while the widths of the plate lines $PL_M$ are varied, but it is not limited as such. Assuming that the mth (m=1, 2, ... M) memory cell $MC_{nm}$ of the nth memory unit $MU_n$ has an area of $A_{nm}$, $A^{nm}=2^{(m-1)}A_{n1}$ is satisfied.

One source/drain region 14A for the first and second selection transistors $TR_1$, $TR_2$ is connected to the data lines $DL_1$, $DL_2$ via a connection hole 35, and another source/drain region 14B of the first selection transistor $TR_1$ is connected to the shared first electrode 41 (the first common node $CN_1$) in the memory unit $MU_1$ of the first layer via a connection hole 37 provided in an insulation layer 36. The other source/drain region 14B of the second selection transistor $TR_2$ is connected to the shared first electrode 51 (the second common node $CN_2$) in the memory unit $MU_2$ of the second layer via the connection hole 37 provided in the insulation layer 36, a pad portion 45 provided on the insulation layer 36 and a connection hole 47 provided in the inter-layer insulation layer 46. Reference numeral 56A in the figure represents an insulation film.

The data line $DL_1$ is connected to a write register $WR_1$ via a write-in transistor $TR_{IN-1}$, and is further connected to a sense amplifier $SA_1$ via a read-out transistor $TR_{OUT-1}$. The data line $DL_2$ is connected to a write register $WR_2$ via a write-in transistor $TR_{IN-2}$, and is further connected to a sense amplifier $SA_2$ via a read-out transistor $TR_{OUT-2}$. The plate line $PL_m$ is connected to a plate line decoder/driver PD. Word lines $WL_1$, $WL_2$, a word line $WL_{IN}$ for controlling the operation of the write-in transistors $TR_{IN-1}$, $TR_{IN-2}$, and a word line $WL_{OUT}$ for controlling the operation of the read-out transistors $TR_{OUT-1}$, $TR_{OUT-2}$ are connected to a word line decoder/driver WD. The word lines $WL_1$, $WL_2$ extend in a direction perpendicular to the sheet of FIG. 13. The second electrode 43 of the memory cell $MC_{1m}$ of the non-volatile memory is shared with a memory cell of a non-volatile memory adjacent in a direction perpendicular to the sheet of FIG. 13, and also serves as the plate line $PL_m$. The second electrode 53 of the memory cell $MC_2$ of the non-volatile memory is shared with a memory cell of a non-volatile memory adjacent in a direction perpendicular to the sheet of FIG. 13, and also serves as the plate line $PL_m$. The word lines $WL_1$, $WL_2$ are shared by the selection transistors $TR_1$, $TR_2$ of the non-volatile memory and selection transistors of a non-volatile memory adjacent in a direction perpendicular to the sheet of FIG. 13.

In the operation of the D/A converter DA according to the sixth embodiment, two series of M-bit (specifically 4-bit) digital data are serially inputted to the write registers $WR_1$, $WR_2$, respectively, and binary data corresponding to the individual bits of the M-bit digital data are temporarily stored in the respective write registers $WR_1$, $WR_2$. The word line $WL_{IN}$ is then set to a high level to thereby turn the write-in transistors $TR_{IN-1}$, $TR_{IN-2}$ on, further, the word lines $WL_1$, $WL_2$ are set to a high level to place the selection transistors $TR_1$, $TR_2$ in a conductive state, the data lines $DL_1$, $DL_2$ and the plate line $PL_m$ are successively driven, and the binary data of the mth bit is written in the mth memory cells $MC_{1m}$, $MC_{2m}$. If the potential of the data lines $DL_1$, $DL_2$ are set to 0 volts and the potential of the plate line $PL_m$ are set to $V_{CC}$ volts, a data of "0" is written in the memory cells $MC_{1m}$, $MC_{2m}$. On the other hand, if the potential of the data lines $DL_1$, $DL_2$ are set to $V_{CC}$ volts and the potential of the plate line $PL_m$ is set to 0 volts, a data of "1", is written in the memory cells $MC_{1m}$, $MC_{2m}$. A potential of, for example, $(\frac{1}{2})V_{CC}$ volts is applied to the plate line $PL_j$ (j≠m) other than the plate line $PL_m$ so as to prevent the data already written in the memory cells $MC_{1j}$, $MC_{2j}$ from being rewritten.

After a desired period has elapsed, the data lines $DL_1$, $DL_2$ are equalized to 0 volts, the word line $WL_{OUT}$ is set to a high level to turn the read-out transistors $TR_{OUT-1}$, $TR_{OUT-2}$ on, further, the word lines $WL_1$, $WL_2$, for example, are set to a high level to place all selection transistors $TR_1$, $TR_2$ in a conductive state, all plate lines $PL_M$ are driven at the same time, and data is simultaneously read out from all memory cells $MC_{1M}$, $MC_{2M}$. More specifically, $V_{CC}$ volts are applied to all plate lines $PL_M$. If, at this point, a data of "1" is stored in the memory cells $MC_{1m}$, $MC_{2m}$, polarization inversion occurs in the ferroelectric layer, which results in an increase in the amount of accumulated charge, and a rise in the electric potential across the data lines $DL_1$, $DL_2$. On the other hand, if a data of "0" is stored in the memory cells $MC_{1m}$, $MC_{2m}$, polarization inversion does not occur in the ferroelectric layer, and the electric potentials across the data lines $DL_1$, $DL_2$ hardly increase. The rise in electric potential $\Delta V$ across the data lines $DL_1$, $DL_2$ can generally be expressed by equation (1) described above. The electric potentials thus generated across the data lines $DL_1$, $DL_2$ are read out by the sense amplifiers $SA_1$, $SA_2$ and are outputted externally. Conversion of two series of digital data to analog data may thus be achieved.

While a case where the data lines $DL_1$, $DL_2$ are simultaneously driven to thereby simultaneously convert two series of digital data to analog data is described above, it is also possible to independently control the data lines $DL_1$, $DL_2$ so as to convert two series of digital data to analog data separately.

The present invention is described hereinabove based on the preferred embodiments thereof, however the present invention is by no means limited thereto. The structures of the non-volatile memory, the structures of the D/A converter, the materials used, the various forming conditions, the configurations of the circuits, the driving methods and the like described above are merely examples, and may be altered as deemed appropriate.

The value of M is not limited to 4, and can be determined based on the number of bits of digital data to be converted, and examples of practical values for M include involutions of 2 (2, 4, 8, 16, . . . ). The value of N need only satisfy the relationship N≧2, and practical values for N include involutions of 2 (2, 4, 8, . . . ).

Figure 14:
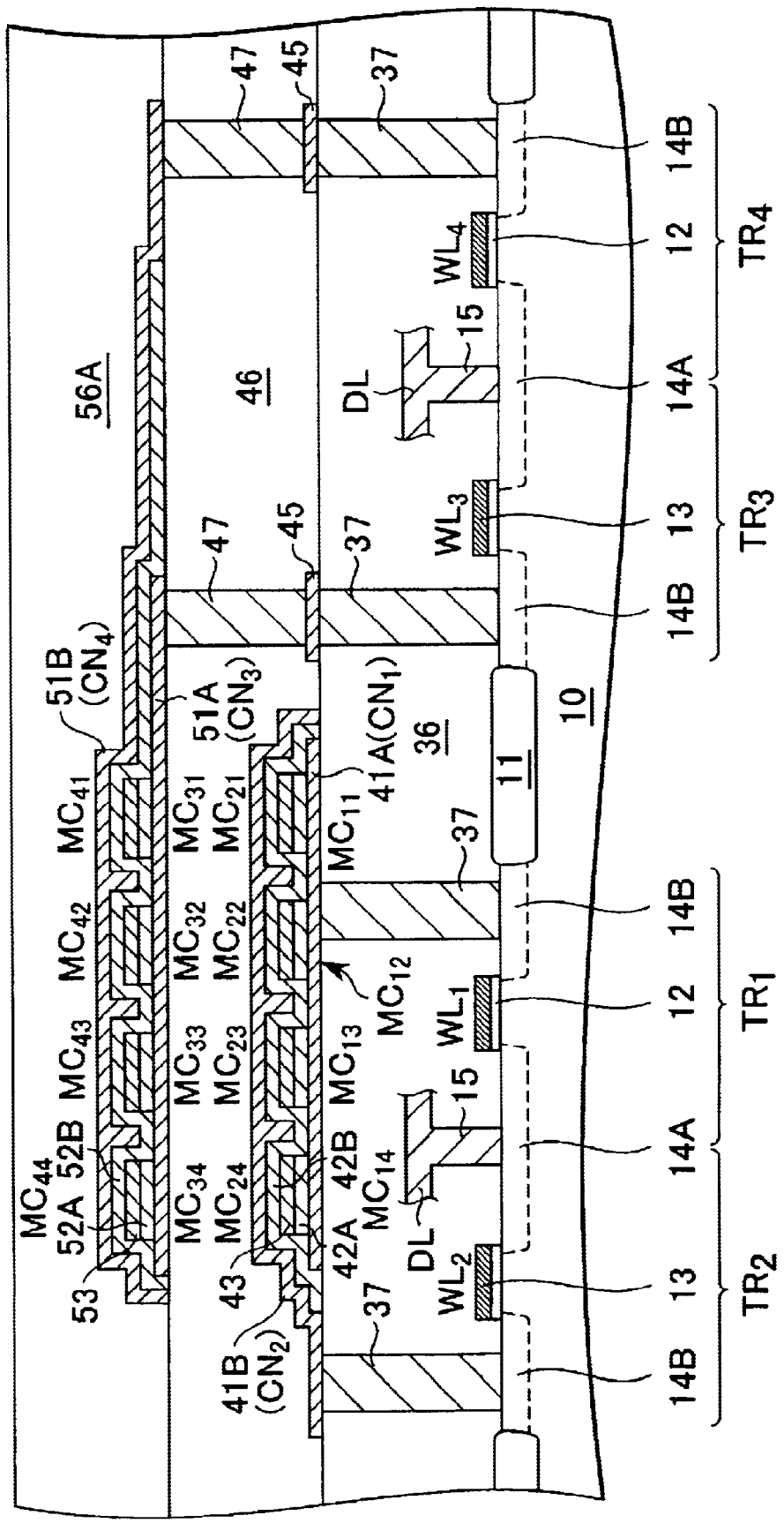
FIG. 14 is a schematic sectional view of a modified example of the ferroelectric non-volatile semiconductor memory in the digital to analog converter according to the fourth or a fifth embodiment of the present invention.
Figure 15:
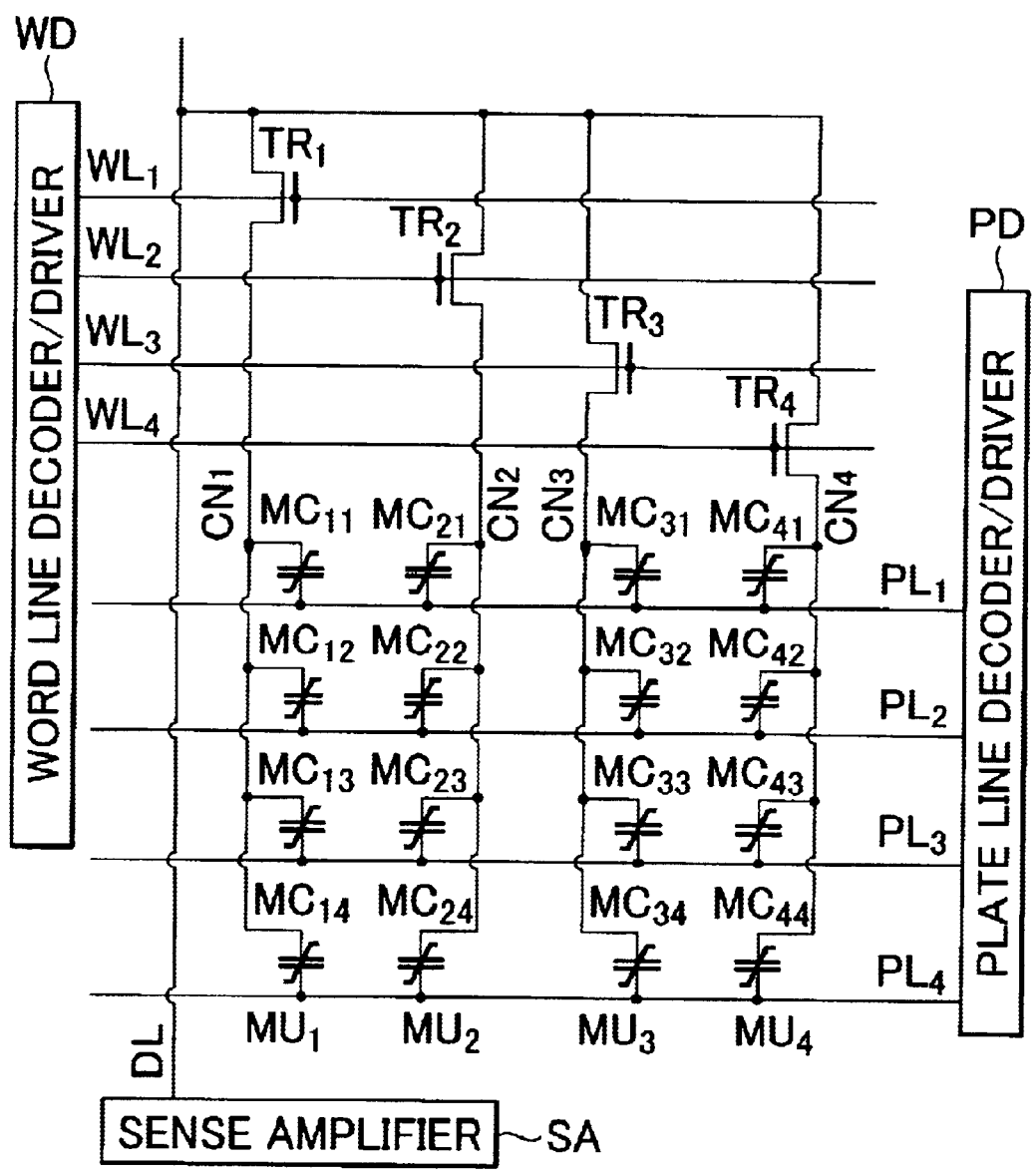
FIG. 15 is a circuit diagram of the ferroelectric non-volatile semiconductor memory shown in FIG. 14.

It is also possible to modify the D/A converters explained with respect to the fourth and fifth embodiments such that they assume the structure shown in FIG. 14. A circuit diagram thereof is shown in FIG. 15. It is to be noted that FIGS. 14 and 15 show only the non-volatile memory portion.

This non-volatile memory comprises a data line DL, N (where N≧2, and, in this example, N=4) selection transistors $TR_1$, $TR_2$, $TR_3$, $TR_4$ each comprising a MOS-FET, N memory units $MU_1$, $MU_2$, $MU_3$, $HU_4$, and plate lines. The memory unit $MU_1$ of the first layer comprises M (where M≧2, and, in this example, M=4) memory cells $MC_{1M}$ (m=1, 2, 3, 4). The memory unit $MU_2$ of the second layer also comprises M (M=4) memory cells $MC_2M$. The memory unit $MU_3$ of the third layer similarly comprises M (M=4) memory cells $MC_{3M}$, and the memory unit $MU_4$ of the fourth layer similarly comprises M (M=4) memory cells MC4M. The number of plate lines provided is M (in this example, 4). The word line $WL_n$ connected to the gate electrode of the selection transistor $TR_n$ is connected to the word line decoder/driver WD. On the other hand, the plate lines $PL_M$ are connected to the plate line decoder/driver PD.

Each of the memory cells $MC_{1m}$ of the memory unit $MU_1$ of the first layer comprises the first electrode 41A, the ferroelectric layer 42A and the second electrode 43; each of the memory cells $MC_{2m}$ of the memory unit $MU_2$ of the second layer comprises the first electrode 41B, the ferroelectric layer 42B and the second electrode 43; each of the memory cells $MC_{3m}$ of the memory unit $MU_3$ of the third layer comprises the first electrode 51A, the ferroelectric layer 52A and the second electrode 53; and each of the memory cells $MC_{4m}$ of the memory unit $MU_4$ of the fourth layer comprises the first electrode 51B, the ferroelectric layer 52B and the second electrode 53. In the memory units $MU_1$, $MU_2$, $MU_3$, $MU_4$, the first electrodes 41A, 41B, 51A, 51B of the memory cells are shared among the respective memory cells. These shared first electrodes 41A, 41B, 51A, 51B are referred to as the common nodes $CN_1$, $CN_2$, $CN_3$, $CN_4$ for convenience.

The shared first electrode 41A (the first common node $CN_1$) of the memory unit $MU_1$ of the first layer is connected to the data line DL via the first selection transistor $TR_1$. The shared first electrode 41B (the second common node $CN_2$) of the memory unit $MU_2$ of the second layer is connected to the data line DL via the second selection transistor $TR_2$. The shared first electrode 51A (the third common node $CN_3$) of the memory unit $MU_3$ of the third layer is connected to the data line DL via the third selection transistor $TR_3$. The shared first electrode 51B (the fourth common node $CN_4$) of the memory unit $MU_4$ of the fourth layer is connected to the data line DL via the fourth selection transistor $TR_4$.

The memory cell $MC_{1m}$ of the memory unit $MU_1$ of the first layer and the memory cell $MC_{2m}$ of the memory unit $MU_2$ of the second layer share the second electrode 43, and this shared mth second electrode 43 is connected to the plate line $PL_m$. The memory cell $MC_{3m}$ of the memory unit $MU_3$ of the third layer and the memory cell $MC_{4m}$ of the memory unit $MU_4$ of the fourth layer share the second electrode 53, and this shared mth second electrode 53 is connected to the plate line $PL_m$. More specifically, the plate line $PL_m$ is formed with extended portions of these shared mth second electrodes 43, 53, and each plate line $PL_m$ is connected in a region not shown in the drawing.

In the non-volatile memory, the memory units MU1, $MU_2$ and memory units $MU_3$, $MU_4$ are layered with the insulation film (the inter-layer insulation film 46) in between each. The memory unit $MU_4$ is covered with the insulation film 56A. The memory unit $MU_1$ is formed above the semiconductor substrate 10 with the insulation layer 36 in between each. A device isolation region 11 is formed on the semiconductor substrate 10. The selection transistors $TR_1$, $TR_2$, $TR_3$, $TR_4$ comprise the gate insulation film 12, the gate electrode 13, and the source/drain regions 14A, 14B. One source/drain region 14A of each of the first selection transistor $TR_1$, second selection transistor $TR_2$, third selection transistor $TR_3$ and fourth selection transistor $TR_4$ is connected to the data line DL via the connection hole (contact hole) 35. The other source/drain region 14B of the first selection transistor $TR_1$ is connected to the first common node $CN_1$ via the connection hole 37, which is provided in the opening formed in the insulation layer 36. The other source/drain region 14B of the second selection transistor $TR_2$ is connected to the second common node $CN_2$ via the connection hole 37. The other source/drain region 14B of the third selection transistor $TR_3$ is connected to the third common node $CN_3$ via the connection hole 37, the pad portion 45 and the connection hole 47 which is provided in an opening formed in the inter-layer insulation film 46. The other source/drain region 14B of the fourth selection transistor $TR_4$ is connected to the fourth common node $CN_4$ via the connection hole 37, the pad portion 45 and the connection hole 47.

The construction of the non-volatile memory described above is also applicable to the non-volatile memories according to the other embodiments of the present invention.

Figure 16:
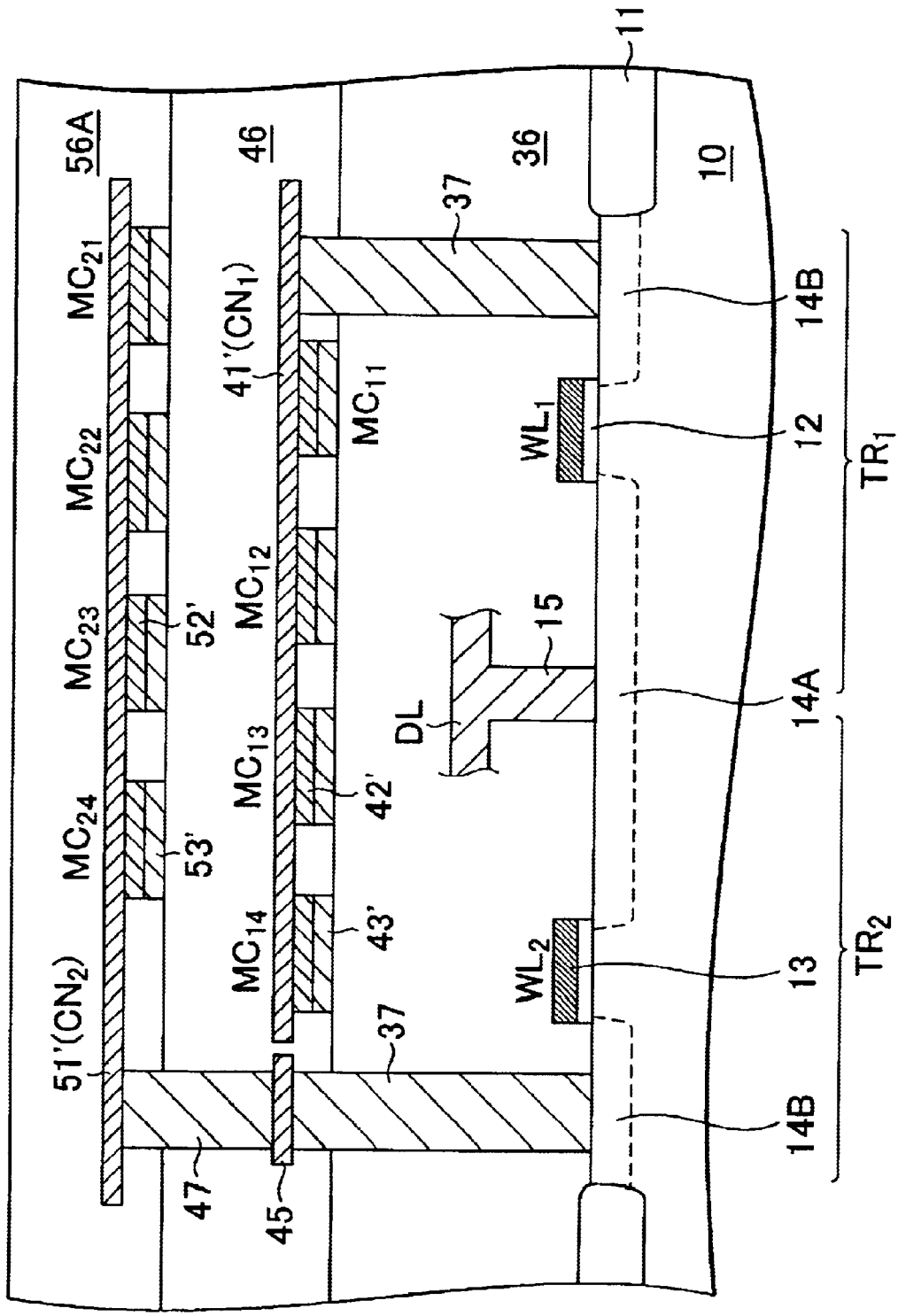
FIG. 16 is a schematic sectional view of another modified example of the ferroelectric non-volatile semiconductor memory in the digital to analog converter according to the fourth or fifth embodiment of the present invention.
Figure 17:
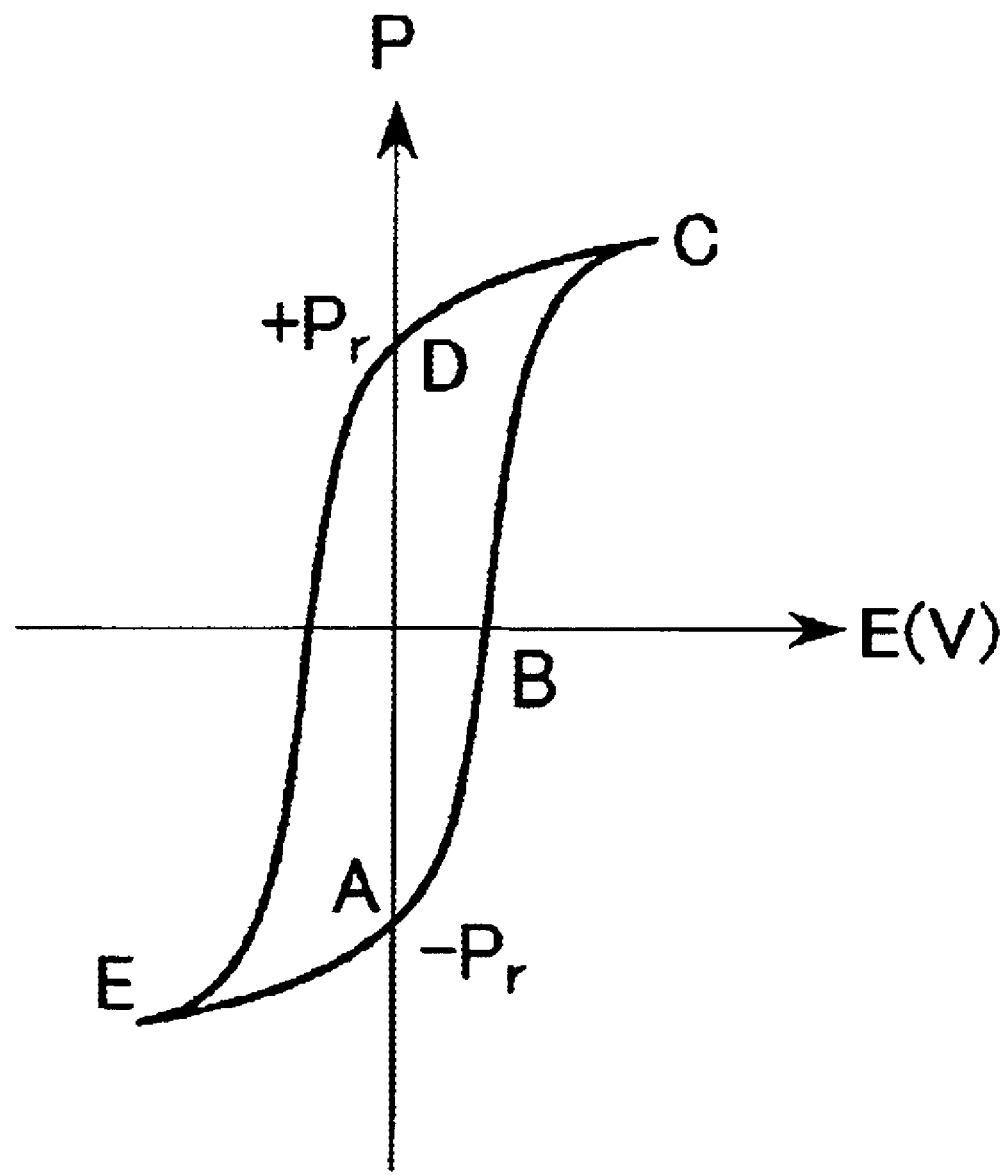
FIG. 17 is a P–E(V) hysteresis loop diagram of a ferroelectric material.

It is also possible, as shown in FIG. 16, for example, to modify the non-volatile memory according to the fourth or fifth embodiment such that first electrodes 41', 51' are the upper electrodes, and second electrodes 43', 53' are the lower electrodes. Such a structure is also applicable to the non-volatile memories according to the other embodiments of the present invention. It is to be noted that FIG. 16 shows only the non-volatile memory portion. Such a structure for the non-volatile memory may also be applied to the non-volatile memories of the other embodiments of the present invention.

The D/A converter of the present invention may further comprise a compensatory circuit which compensates the output for better linearity. The converter may still further include an amplifier in the stages following the sense amplifier in order to amplify the analog data.

It is to be understood that the invention is not limited to the specific examples and embodiments, including those shown in the drawings, which are intended to assist a person skilled in the art in practicing the invention. Many modifications and improvements may be made without departing from the scope of the invention, which should be determined based on the claims below, including any equivalents thereof.

What is claimed is:

1. A digital to analog converter comprising a ferroelectric non-volatile semiconductor memory, wherein said ferroelectric non-volatile semiconductor memory comprises:
(A) a data line; and
(B) N (where N≧2) memory units;
each of said memory units comprises:
(B-1) a selection transistor;
(B-2) a memory cell comprising a first electrode, a ferroelectric layer and a second electrode; and (B-3) a plate line;

said first electrode is connected to said data line via said selection transistor, said second electrode is connected to said plate line, and the area of said ferroelectric layer of each of said memory cells varies among said memory cells.

2. The digital to analog converter according to claim 1, wherein the area of said ferroelectric layer of each of said memory cells is varied by varying the size of said ferroelectric layer of each of said memory cells.

3. The digital to analog converter according to claim 2, wherein the size of said ferroelectric layer of each of said memory cells is varied by keeping the widths of said first electrodes uniform and varying the widths of said plate lines.

4. The digital to analog converter according to claim 2, wherein the size of said ferroelectric layer of each of said memory cells is varied by keeping the widths of said plate lines uniform and varying the widths of said first electrodes.

5. The digital to analog converter as claimed in claim 2, wherein the size of said ferroelectric layer of each of said memory cells is varied by varying the widths of said first electrodes and the widths of said plate lines.

6. The digital to analog converter according to claim 1, wherein each of said memory cells comprises 1 or more unit memory cells, and the area of said ferroelectric layer is varied by varying the number of said unit memory cells in said memory cells.

7. A digital to analog converter comprising a ferroelectric non-volatile semiconductor memory, wherein said ferroelectric non-volatile semiconductor memory comprises:

(A) a data line;

(B) a memory unit comprising M (where M≧2) memory cells; and (C) M plate lines;

each of said memory cells comprises a first electrode, a ferroelectric layer and a second electrode, said first electrode of said memory cells is shared in said memory unit, said shared first electrode is connected to said data line, said second electrode of the mth (where m=1, 2, ... M) of said memory cells in said memory unit is connected to the mth of said plate lines, and the area of said ferroelectric layer of each of said memory cells varies among the memory cells.

8. The digital to analog converter according to claim 7, wherein the area of said ferroelectric layer of each of said memory cells is varied by varying the size of said ferroelectric layer of each of said memory cells.

9. The digital to analog converter according to claim 8, wherein the size of said ferroelectric layer of each of said memory cells is varied by keeping the widths of said first electrodes uniform and varying the widths of said plate lines.

10. The digital to analog converter according to claim 8, wherein the size of said ferroelectric layer of each of said memory cells is varied by keeping the widths of said plate lines uniform and varying the widths of said first electrodes.

11. The digital to analog converter as claimed in claim 8, wherein the size of said ferroelectric layer of each of said memory cells is varied by varying the widths of said first electrodes and the widths of said plate lines.

12. The digital to analog converter according to claim 7, wherein each of said memory cells comprises 1 or more unit memory cells, and the area of said ferroelectric layer is varied by varying the number of said unit memory cells in said memory cells.

13. A digital to analog converter comprising a ferroelectric non-volatile semiconductor memory, wherein said ferroelectric non-volatile semiconductor memory comprises:

(A) a data line;

(B) N (where N≧2) memory units each comprising M (where M≧2) memory cells; and (C) M×N plate lines;

said N memory units are layered with an insulation layer in between each, each of said memory cells comprises a first electrode, a ferroelectric layer and a second electrode, said first electrode of said memory cell is shared in each of said memory units, said shared first electrode is connected to said data line, said second electrode of the mth (where m=1, 2, ... M) of said memory cells in said memory unit of the nth (where n=1, 2, ... N) layer is connected to the [(n−1)M+m]th of said plate lines, and the area of said ferroelectric material layer of each of said memory cells varies among said memory cells.

14. The digital to analog converter according to claim 13, wherein the area of said ferroelectric layer of each of said memory cells is varied by varying the size of said ferroelectric layer of each of said memory cells.

15. The digital to analog converter according to claim 14, wherein the size of said ferroelectric layer of each of said memory cells is varied by keeping the widths of said first electrodes uniform and varying the widths of said plate lines.

16. The digital to analog converter according to claim 14, wherein the size of said ferroelectric layer of each of said memory cells is varied by keeping the widths of said plate lines uniform and varying the widths of said first electrodes.

17. The digital to analog converter as claimed in claim 14, wherein the size of said ferroelectric layer of each of said memory cells is varied by varying the widths of said first electrodes and the widths of said plate lines.

18. The digital to analog converter according to claim 13, wherein each of said memory cells comprises 1 or more unit memory cells, and the area of said ferroelectric layer is varied by varying the number of said unit memory cells in said memory cells.

19. A digital to analog converter comprising a ferroelectric non-volatile semiconductor memory, wherein said ferroelectric non-volatile semiconductor memory comprises:

(A) a data line;

(B) N (where N≧2) selection transistors;

(C) N memory units each comprising M (where M≧2) memory cells; and (D) M plate lines;

each of said memory cells comprises a first electrode, a ferroelectric layer and a second electrode, said first electrode of said memory cells is shared in each of said memory units, said shared first electrode of the nth (where n=1, 2, ... N) of said memory units is connected to said data line via the nth of said selection transistors, said second electrode of the mth (where m=1, 2, ... M) of said memory cells in said nth memory unit is connected to the mth of said plate lines shared between said memory units, and the area of said ferroelectric layer of each of said memory cells in each of said memory units varies among said memory cells.

20. The digital to analog converter according to claim 19, wherein the area of said ferroelectric layer of each of said memory cells is varied by varying the size of said ferroelectric layer of each of said memory cells.

21. The digital to analog converter according to claim 20, wherein the size of said ferroelectric layer of each of said memory cells is varied by keeping the widths of said first electrodes uniform and varying the widths of said plate lines.

22. The digital to analog converter according to claim 20, wherein the size of said ferroelectric layer of each of said memory cells is varied by keeping the widths of said plate lines uniform and varying the widths of said first electrodes.

23. The digital to analog converter as claimed in claim 20, wherein the size of said ferroelectric layer of each of said memory cells is varied by varying the widths of said first electrodes and the widths of said plate lines.

24. The digital to analog converter according to claim 19, wherein each of said memory cells comprises 1 or more unit memory cells, and the area of said ferroelectric layer is varied by varying the number of said unit memory cells in said memory cells.

25. A digital to analog converter comprising a ferroelectric non-volatile semiconductor memory, wherein
said ferroelectric non-volatile semiconductor memory comprises:
(A) N (where N≧2) data lines;
(B) N selection transistors;
(C) N memory units each comprising M (where M≧2) memory cells; and
(D) M plate lines;
said N memory units are layered with an insulating layer in between each,
each of said memory cells comprises a first electrode, a ferroelectric layer and a second electrode,
said first electrode of each of said memory cells is shared in each of said memory units,
said shared first electrode of said memory unit of an nth (where n=1, 2, . . . N) layer is connected to the nth of said data lines via the nth of said selection transistors,
said second electrode of the mth (where m=1, 2, . . . M) of said memory cells in said memory unit of the nth layer is connected to the mth of said plate lines shared by said memory units, and
the area of said ferroelectric layer of each of said memory cells in each of said memory units varies among said memory cells.

26. The digital to analog converter according to claim 25, wherein the area of said ferroelectric layer of each of said memory cells is varied by varying the size of said ferroelectric layer of each of said memory cells.

27. The digital to analog converter according to claim 26, wherein the size of said ferroelectric layer of each of said memory cells is varied by keeping the widths of said first electrodes uniform and varying the widths of said plate lines.

28. The digital to analog converter according to claim 26, wherein the size of said ferroelectric layer of each of said memory cells is varied by keeping the widths of said plate lines uniform and varying the widths of said first electrodes.

29. The digital to analog converter as claimed in claim 26, wherein the size of said ferroelectric layer of each of said memory cells is varied by varying the widths of said first electrodes and the widths of said plate lines.

30. The digital to analog converter according to claim 25, wherein each of said memory cells comprises 1 or more unit memory cells, and the area of said ferroelectric layer is varied by varying the number of said unit memory cells in said memory cells.

31. A method for converting M bits of digital data to analog data using a digital to analog converter, wherein
said digital to analog converter includes a ferroelectric non-volatile semiconductor memory,
said ferroelectric non-volatile semiconductor memory comprises:
(A) a data line; and
(B) N (where N≧2) memory units;
each of said memory units comprises:
(B-1) a selection transistor;
(B-2) a memory cell comprising a first electrode, a ferroelectric layer and a second electrode; and
(B-3) a plate line;
said first electrode is connected to said data line via said selection transistor,
said second electrode is connected to said plate line,
the area of said ferroelectric layer of each of said memory cells varies among said memory cells, and
said method comprises:
setting said selection transistor to a conductive state, and driving said data line and said plate line to write a binary data of the mth bit (where m=1, 2, . . . M) in said memory cell of the mth of said memory units;
setting said selection transistor to a conductive state, and driving all of said plate lines to thereby simultaneously read out data from said memory cell in each of said memory unit; and
outputting the resultant electric potential generated across said data line.

32. The method for converting digital data to analog data according to claim 31, wherein the area of said ferroelectric layer of each of said memory cells is varied by varying the size of said ferroelectric layer of each of said memory cells.

33. The method for converting digital data to analog data according to claim 32, wherein the size of said ferroelectric layer of each of said memory cells is varied by keeping the widths of said first electrodes uniform and varying the widths of said plate lines.

34. The method for converting digital data to analog data according to claim 32, wherein the size of said ferroelectric layer of each of said memory cells is varied by keeping the widths of said plate lines uniform and varying the widths of said first electrodes.

35. The method for converting digital data to analog data according to claim 32, wherein the size of said ferroelectric layer of each of said memory cells is varied by varying the widths of said first electrodes and the widths of said plate lines.

36. The method for converting digital data to analog data according to claim 31, wherein each of said memory cells comprises one or more unit memory cells, and the size of said ferroelectric layer of each of said memory cells is varied by varying the number of said unit memory cells in each of said memory cells.

37. A method for converting M bits of digital data to analog data using a digital to analog converter, wherein
said digital to analog converter includes a ferroelectric non-volatile semiconductor memory,
said ferroelectric non-volatile semiconductor memory comprises:
(A) a data line;
(B) a memory unit comprising M (where M≧2) memory cells; and
(C) M plate lines;
each of said memory cells comprises a first electrode, a ferroelectric layer and a second electrode, said first electrode of said memory cells is shared in said memory unit and is connected to said data line, said second electrode of the mth (where m=1, 2, ... M) of said memory cells in said memory unit is connected to the mth of said plate lines, the area of said ferroelectric layer of each of said memory cells varies among the memory cells, and said method comprises:
    driving said data line and said plate lines to write a binary data of the mth bit in said mth memory cell;
    driving all of said plate lines to simultaneously read out data from all of said memory cells; and
    outputting the resultant electric potential generated across said data line.

38. The method for converting digital data to analog data according to claim 37, wherein the area of said ferroelectric layer of each of said memory cells is varied by varying the size of said ferroelectric layer of each of said memory cells.

39. The method for converting digital data to analog data according to claim 38, wherein the size of said ferroelectric layer of each of said memory cells is varied by keeping the widths of said first electrodes uniform and varying the widths of said plate lines.

40. The method for converting digital data to analog data according to claim 38, wherein the size of said ferroelectric layer of each of said memory cells is varied by keeping the widths of said plate lines uniform and varying the widths of said first electrodes.

41. The method for converting digital data to analog data according to claim 38, wherein the size of said ferroelectric layer of each of said memory cells is varied by varying the widths of said first electrodes and the widths of said plate lines.

42. The method for converting digital data to analog data according to claim 37, wherein each of said memory cells comprises one or more unit memory cells, and the size of said ferroelectric layer of each of said memory cells is varied by varying the number of said unit memory cells in each of said memory cells.

43. A method for converting M×N bits of digital data to analog data using a digital to analog converter, wherein
    said digital to analog converter includes a ferroelectric non-volatile semiconductor memory,
    said ferroelectric non-volatile semiconductor memory comprises:
        (A) a data line;
        (B) N (where N≧2) memory units each comprising M (where M≧2) memory cells; and
        (C) M×N plate lines;
    said N memory units are layered with an insulation layer in between each,
    each of said memory cells comprises a first electrode, a ferroelectric layer and a second electrode,
    said first electrode of said memory cells is shared in each of said memory units and is connected to said data line,
    said second electrode of the mth (where m=1, 2, ... M) of said memory cells in said memory unit of an nth (where, n=1, 2, ... , N) layer is connected to the [(n−1)M+m]th of said plate lines,
    the area of said ferroelectric layer of each of said memory cells varies among said memory cells, and
    said method comprises:
        driving said data line and said plate lines to write a binary data of the [(n−1)M+m]th bit in the [(n−1)M+m]th of said memory cells;
        activating all of said plate lines to simultaneously read out data from all of said memory cells; and
        outputting the resultant electric potential generated across said data line.

44. The method for converting digital data to analog data according to claim 43, wherein the area of said ferroelectric layer of each of said memory cells is varied by varying the size of said ferroelectric layer of each of said memory cells.

45. The method for converting digital data to analog data according to claim 44, wherein the size of said ferroelectric layer of each of said memory cells is varied by keeping the widths of said first electrodes uniform and varying the widths of said plate lines.

46. The method for converting digital data to analog data according to claim 44, wherein the size of said ferroelectric layer of each of said memory cells is varied by keeping the widths of said plate lines uniform and varying the widths of said first electrodes.

47. The method for converting digital data to analog data according to claim 44, wherein the size of said ferroelectric layer of each of said memory cells is varied by varying the widths of said first electrodes and the widths of said plate lines.

48. The method for converting digital data to analog data according to claim 43, wherein each of said memory cells comprises one or more unit memory cells, and the size of said ferroelectric layer of each of said memory cells is varied by varying the number of said unit memory cells in each of said memory cells.

49. A method for converting M bits of digital data to analog data using a digital to analog converter, wherein
    said digital to analog converter includes a ferroelectric non-volatile semiconductor memory,
    said ferroelectric non-volatile semiconductor memory comprises:
        (A) a data line;
        (B) N (where N≧2) selection transistors;
        (C) N memory units each comprising M (where M≧2) memory cells; and
        (D) M plate lines;
    each of said memory cells comprises a first electrode, a ferroelectric layer and a second electrode,
    said first electrode of said memory cells is shared in each of said memory units,
    said shared first electrode of the nth (where n=1, 2, ... N) of said memory units is connected to said data line via the nth of said selection transistors,
    said second electrode of the mth (where m=1, 2, ... M) of said memory cells in said nth memory unit is connected to the mth of said plate lines shared between said memory units,
    the area of said ferroelectric layer of each of said memory cells in each of said memory units varies among the memory cells, and
    said method comprises:
        setting said nth selection transistor to a conductive state, and driving said data line and said plate lines to write a binary data of the mth bit in said mth memory cell in said nth memory unit;
        setting said nth selection transistor to a conductive state, and activating all of said plate lines to simultaneously read out data from said memory cells in the nth of said memory units; and
        outputting the resultant electric potential generated across said data line.

50. The method for converting digital data to analog data according to claim 49, wherein the area of said ferroelectric layer of each of said memory cells is varied by varying the size of said ferroelectric layer of each of said memory cells.

51. The method for converting digital data to analog data according to claim 50, wherein the size of said ferroelectric layer of each of said memory cells is varied by keeping the widths of said first electrodes uniform and varying the widths of said plate lines.

52. The method for converting digital data to analog data according to claim 50, wherein the size of said ferroelectric layer of each of said memory cells is varied by keeping the widths of said plate lines uniform and varying the widths of said first electrodes.

53. The method for converting digital data to analog data according to claim 50, wherein the size of said ferroelectric layer of each of said memory cells is varied by varying the widths of said first electrodes and the widths of said plate lines.

54. The method for converting digital data to analog data according to claim 49, wherein each of said memory cells comprises one or more unit memory cells, and the size of said ferroelectric layer of each of said memory cells is varied by varying the number of said unit memory cells in each of said memory cells.

55. A method for converting M×N bits of digital data to analog data using a digital to analog converter, wherein
    said digital to analog converter includes a ferroelectric non-volatile semiconductor memory,
    said ferroelectric non-volatile semiconductor memory comprises:
      (A) a data line;
      (B) N (where N≧2) selection transistors;
      (C) N memory units each comprising M (where M≧2) memory cells; and
      (D) M plate lines;
    each of said memory cells comprises a first electrode, a ferroelectric layer and a second electrode,
    said first electrode of said memory cells is shared in each of said memory units,
    said shared first electrode of the nth (where n=1, 2, ... N) of said memory units is connected to said data line via the nth of said selection transistors,
    said second electrode of the mth (where m=1, 2, ... M) of said memory cells in the nth of said memory units is connected to the mth of said plate lines shared by said memory units,
    the area of said ferroelectric layer of each of said memory cells in each of said memory units varies among the memory cells, and
    said method comprises:
      setting said nth selection transistor to a conductive state, and driving said data line and said plate lines to write a binary data of the [(n−1)M+m]th bit in said mth memory cell in said nth memory unit;
      setting all of said selection transistors to a conductive state, and driving all of said plate lines to simultaneously read out data from all of said memory cells in said nth memory unit; and
      outputting the resultant electric potential generated across said data line.

56. The method for converting digital data to analog data according to claim 55, wherein the area of said ferroelectric layer of each of said memory cells is varied by varying the size of said ferroelectric layer of each of said memory cells.

57. The method for converting digital data to analog data according to claim 56, wherein the size of said ferroelectric layer of each of said memory cells is varied by keeping the widths of said first electrodes uniform and varying the widths of said plate lines.

58. The method for converting digital data to analog data according to claim 56, wherein the size of said ferroelectric layer of each of said memory cells is varied by keeping the widths of said plate lines uniform and varying the widths of said first electrodes.

59. The method for converting digital data to analog data according to claim 56, wherein the size of said ferroelectric layer of each of said memory cells is varied by varying the widths of said first electrodes and the widths of said plate lines.

60. The method for converting digital data to analog data according to claim 55, wherein each of said memory cells comprises one or more unit memory cells, and the size of said ferroelectric layer of each of said memory cells is varied by varying the number of said unit memory cells in each of said memory cells.

61. A method for converting M bits of digital data to analog data using a digital to analog converter, wherein
    said digital to analog converter includes a ferroelectric non-volatile semiconductor memory,
    said ferroelectric non-volatile semiconductor memory comprises:
      (A) N (where N≧2) data lines;
      (B) N selection transistors;
      (C) N memory units each comprising M (where M≧2) memory cells; and
      (D) M plate lines;
    said N memory units are layered with an insulation layer in between each,
    each of said memory cells comprises a first electrode, a ferroelectric layer and a second electrode,
    said first electrode of said memory cells is shared in each of said memory units,
    said shared first electrode of said memory unit of the nth (where n=1, 2, ... N) layer is connected to the nth of said data lines via the nth of said selection transistors,
    said second electrode of the mth (where m=1, 2, ... M) of said memory cells of said memory unit of the nth layer is connected to the mth of said plate lines shared by said memory units,
    the area of said ferroelectric material layer of each of said memory cells in each of said memory units varies among said memory cells, and
    said method comprises:
      setting said nth selection transistor to a conductive state, and driving said nth data line and said plate lines to write a binary data of the mth bit in said mth memory cell in said memory unit of the nth layer;
      setting said nth selection transistor to a conductive state, and driving all of said plate lines to simultaneously read out data from all of said memory cells in said memory unit of the nth layer; and
      outputting the resultant electric potential generated across said nth data line.

62. The method for converting digital data to analog data according to claim 61, wherein the area of said ferroelectric layer of each of said memory cells is varied by varying the size of said ferroelectric layer of each of said memory cells.

63. The method for converting digital data to analog data according to claim 62, wherein the size of said ferroelectric layer of each of said memory cells is varied by keeping the widths of said first electrodes uniform and varying the widths of said plate lines.

64. The method for converting digital data to analog data according to claim 62, wherein the size of said ferroelectric layer of each of said memory cells is varied by keeping the widths of said plate lines uniform and varying the widths of said first electrodes.

65. The method for converting digital data to analog data according to claim 62, wherein the size of said ferroelectric layer of each of said memory cells is varied by varying the widths of said first electrodes and the widths of said plate lines.

66. The method for converting digital data to analog data according to claim 61, wherein each of said memory cells comprises one or more unit memory cells, and the size of said ferroelectric layer of each of said memory cells is varied by varying the number of said unit memory cells in each of said memory cells.

* * * * *